(12) United States Patent
Tong et al.

(10) Patent No.: US 7,151,804 B2
(45) Date of Patent: *Dec. 19, 2006

(54) SYSTEM AND METHOD FOR REDUCING THE PEAK POWER IN MULTI-CARRIER MODULATION

(75) Inventors: Wen Tong, Ottowa (CA); Amir Khandanl, Kirchner (CA)

(73) Assignee: Nortel Networks Limited, St. Laurent (CA)

( * ) Notice: Subject to any disclaimer, the term of this patent is extended or adjusted under 35 U.S.C. 154(b) by 805 days.

This patent is subject to a terminal disclaimer.

(21) Appl. No.: 10/226,172

(22) Filed: Aug. 23, 2002

(65) Prior Publication Data

US 2003/0099302 A1 May 29, 2003

Related U.S. Application Data

(60) Provisional application No. 60/314,169, filed on Aug. 23, 2001, provisional application No. 60/314,168, filed on Aug. 23, 2001.

(51) Int. Cl.
*H04K 1/10* (2006.01)
*H04L 5/12* (2006.01)

(52) U.S. Cl. .................................. 375/260; 375/264
(58) Field of Classification Search ......... 375/260–264
See application file for complete search history.

(56) References Cited

U.S. PATENT DOCUMENTS

| | | | | |
|---|---|---|---|---|
| 5,115,453 A | * | 5/1992 | Calderbank et al. | 375/265 |
| 5,388,124 A | * | 2/1995 | Laroia et al. | 375/286 |
| 5,832,044 A | * | 11/1998 | Sousa et al. | 375/347 |
| 6,125,103 A | | 9/2000 | Bäuml et al. | 370/203 |
| 6,266,795 B1 | * | 7/2001 | Wei | 714/755 |

2003/0095498 A1   5/2003 Sato et al.

FOREIGN PATENT DOCUMENTS

| | | |
|---|---|---|
| EP | 0540232 | 10/1992 |
| EP | 0624018 | 4/1994 |
| JP | 11205279 | 7/1999 |
| JP | 11215091 | 8/1999 |
| WO | 9953662 | 4/1999 |
| WO | 9953662 | 10/1999 |

OTHER PUBLICATIONS

A. K. khandani and P. Kabal; Address Decomposition for the Shaping of Multi-Dimensional Signal Constellations; IEEE, 1992, pp. 1774-1778.

Stefan H. Müller, Robert W. Bäuml, Robert F. H. Fischer and Johannes B. Huber; OFDM With Reduced Peak-to-Average Power Ratio by Multiple Signal Representation; Ann. Telecommunications., 52, No. 1-2, 1997, pp. 58-67.

T. N. Zogakis and J. M. Cioffi; Application of Shaping to Discrete Multitone Modulation; IEEE, 1994, pp. 1894-1898.

(Continued)

*Primary Examiner*—Khai Tran
*Assistant Examiner*—Cicely Ware

(57) ABSTRACT

A multi-tone modulation method is provided which reduces a peak average power ratio. The method involves defining a respective signal constellation for each center frequencies having redundant mappings for each set of input elements, and then selecting a particular permutation of mappings having a reduced peak power for the multi-tone signal. A method of shaping is also employed in which a hierarchy of blocks are defined, each layer having fewer blocks than each previous layer. The hierarchy is used to select a particular subset of an expanded constellation.

37 Claims, 12 Drawing Sheets

OTHER PUBLICATIONS

A. K. Khandani and P. Kabal; Efficient, Nearly Optimum Addressing Schemes Based on Partitioning the Constellation Into the Union of Blocks; IEEE, 1993, pp. 1076-1080.

Robertson, Patrick; Wörz, Thomas; Bandwidth-Efficient Turbo. Trellis-Coded Modulation Using Punctured Component Codes; IEEE Journal on Selected Areas in Communications, vol. 16, No. 2, Feb. 1998, pp. 206-218.

Khandani, Amir K.; Kabal, Peter; Shaping Multidimensional Signal Spaces—Part I: Optimum Shaping, Shell Mapping; IEEE Transactions on Information Theory, vol. 39, No. 6, Nov. 1993, pp. 1799-1808.

Khandani, Amir K.; Kabal, Peter; Shaping Multidimensional Signal Spaces—Part II: Shell-Addressed Constellations; IEEE Transactions on Information Theory, vol. 39, No. 6, Nov. 1993, pp. 1809-1819.

Le Goff, Stéphane; Glavieux, Alain; Berrou, Claude; Turbo-Codes and High Spectral Efficiency Modulation; IEEE, 1994, pp. 645-649.

Wachsmann, Udo; Fischer, Robert F.H.; Huber, Johannes B.; Multilevel Codes: Theoretical Concepts and Practical Design Rules; IEEE Transaction On Information Theory, vol. 45, No. 5, Jul. 1999; pp. 1361-1391.

Papke, L., Fazel, K.; Combined Multilevel Turbo-Code With MR-Modulation; IEEE, 1995; pp. 668-672.

Khandani, A.K.; Kabal, P.; Shaping of Multi-Dimensional Signal Constellations Using a Lookup Table; IEEE, 1992, pp. 927-931.

Khandani, A.K.; An Efficient Addressing Scheme for Shaping of Multi-Dimensional Signal Constellations Using a Lookup Table; IEEE, 1994, pp. 354-357.

Kozintsev, Igor; Ramchandran, Kannan; Robust Image Transmission Over Energy-Constrained Time-Varying Channels Using Multiresolution Joint Source-Channel Coding; IEEE, 1998, pp. 1012-1026.

Peak to Average Power Reduction for OFDM Schemes by Selective Scrambling. IEEE Electronics Letters, vol. 32, No. 21. Oct. 10, 1996, p. 1963-1964.

* cited by examiner ial Application Nos. 60/314,169 and 60/314,168 filed on
SYSTEM AND METHOD FOR REDUCING THE PEAK POWER IN MULTI-CARRIER MODULATION

RELATED APPLICATIONS

This application claims the benefit of prior U.S. Provisional Application Nos. 60/314,169 and 60/314,168 filed on Aug. 23, 2001.

FIELD OF THE INVENTION

The invention relates to multi-carrier modulation systems and methods.

BACKGROUND OF THE INVENTION

Conventional systems and methods for multi-tone modulation employ a signal constellation for each of a plurality of center frequencies in which each possible permutation of data elements, such as bits, is represented uniquely.

A multi-tone signal consists of data elements modulated onto each center frequency signal constellation. This modulation may be done on a per frequency basis, or may be done in parallel using IFFT technology for example Disadvantageously, some permutations of constellation points for the frequencies will result in a high peak power in the multi-tone signal. Other permutations of constellation points for the frequencies will result in a low peak power in the multi-tone signal.

An example of this is shown in FIG. 1, where shown at 10 is a multi-carrier layout which may be used in OFDM for example. In this example, there are eight carriers. The amplitude of the multi-carrier signal results from complex addition of constellation points used for the multiple carriers. Most of the time, this complex addition will result in a value near some average value since the values being combined are typically somewhat random. An example of a somewhat random complex addition is given at 12 with the magnitude of the combination being indicated at 14.

In other cases, the complex addition will result in a large peak because the values all combine additively. An example of this is given at 16, where the magnitude of the combination is indicated at 18.

It would be advantageous to have a multi-carrier modulation method which did not suffer from these disadvantages.

SUMMARY OF THE INVENTION

One broad aspect of the invention provides a multi-tone modulation method. The method involves defining a respective signal constellation comprising a plurality of constellation points for each of a plurality of center frequencies; defining for each tone and for each permutation of values for M data elements, a respective set of at least one constellation point any one of which may be used to represent the permutation of values for M data elements thereby providing a choice of constellation points for the permutation of values for M data elements, with at least one said set of at least one constellation point having more than one constellation point; generating a multi-tone signal by mapping data elements to each of said plurality of signal constellations and where there is a choice of constellation points, selecting a constellation point which will result in a reduced peak average power ratio for the multi-tone signal.

In some embodiments, selecting a constellation point which will result in a reduced peak power for the multi-tone signal where there is a choice of constellation points comprises searching through all possible permutations of choices of constellation points for a set of constellation points which will result in an absolute minimum possible peak average power ratio.

In some embodiments, selecting a constellation point which will result in a reduced peak power for the multi-tone signal where there is a choice of constellation points comprises searching through possible permutations of choices of constellation points for a set of constellation points which will result in a peak average power ratio which is less than a predetermined threshold.

In some embodiments, each set of at least one constellation point comprises two constellation points.

Another broad aspect of the invention provides a method of modulating sets of M×K data elements to a multi-tone signal, with K data elements modulated to each of M center frequencies, where K>=1 and M>=2. The method involves, for each of the M center frequencies and for each permutation of values for K data elements, defining a respective plurality of constellation points which may be used to represent the permutation of values for K data elements at that center frequency; for a particular set of M×K data elements defining a particular permutation of values for K data elements for each of the M center frequencies, determining for each of the M center frequencies the particular respective plurality of constellation points; selecting a single constellation point from each particular respective plurality of constellation points such that a peak average power ratio of the multi-tone signal is reduced.

In some embodiments, searching for a combination of single constellation points involves randomly selecting a constellation point from each particular respective plurality of constellation points; evaluating a peak average power ratio using the randomly selected constellation points; in the event the peak power ratio is less than the pre-determined threshold, stopping the search; repeatedly, until the peak average power ratio is less than the pre-determined threshold, changing at least one of the randomly selected constellation points to be a different constellation point in the particular respective plurality of constellation points to which the at least one of the randomly selected constellation points belongs and re-evaluating the peak average power ratio.

In some embodiments, for each respective signal constellation identifying the at least one constellation point for a given permutation of values for the M data elements involves performing constellation shaping each permutation of M data elements and at least one dummy data element, for each respective signal constellation the constellation shaping being performed for each permutation of dummy data element values to produce a respective shaped output, the respective shaped outputs for a given signal constellation collectively comprising the at least one constellation point for the permutation of values for the M data elements.

Another broad aspect of the invention provides a method of performing constellation shaping for a signal constellation comprising a plurality of constellation points. The method involves associating a cost with each of the plurality of constellation points; defining a hierarchy of blocks, the hierarchy having a plurality of layers comprising at least a first layer and a last layer, each layer having fewer blocks than each previous layer; wherein the first layer is formed by ordering all of the constellation points according to cost, and then assigning a first lowest cost group of constellation points to a first shaping partition, a second lowest cost group of constellation points to a second shaping partition dividing comprises a plurality of shaping partitions, and so on until a highest cost group of constellation points assigned to a last shaping partition, each shaping partition being assigned a cost based on the costs of the constellation points in the shaping partition, each shaping partition being a first layer block; wherein an element in each other layer is formed by combining two blocks of a previous layer and is assigned a cost based on the costs of the two blocks of the previous layer, a block of each layer being comprised of one of the elements according to cost, or a group of the elements according to cost; the last layer having a single block comprising a plurality of elements; shaping gain being achieved by only mapping to a subset of the elements of the last layer.

In some embodiments the cost assigned to each constellation point is its energy.

In some embodiments, at least some of the layers blocks are simply reordered combined blocks of a previous layer.

In some embodiments, for layers in which blocks are groups of re-ordered combined blocks of a previous layer, all groups are the same size.

In some embodiments, in at least one layer in which blocks are groups of re-ordered combined blocks of a previous layer, the groups have different sizes.

The method may further involve performing addressing by applying a first subset of a set of input bits to identify an element in the block of the highest layer; applying subsequent subsets of the set of input bits to identify blocks in subsequent layers, with a particular shaping partition being identified in the first layer; at the first layer, applying a final subset of input bits to identify a particular signal constellation point within the particular shaping partition identified in the first layer.

In some embodiments, Huffman tree based addressing is employed. In other embodiments, fixed tree based addressing is employed.

In some embodiments, a 256 point constellation is employed, there are 16 layer one partitions each comprising 16 constellation points, there are 8 layer two blocks each containing 16 elements, there are 4 layer 3 blocks each containing 8 elements, the 8 elements having sizes {16, 16, 32, 32, 32, 32, 32, 64}, there are 2 layer 4 blocks each containing 64 elements, and there is one layer 5 block containing 4096 elements.

In some embodiments, the input bits comprise a plurality of data bits and at least one dummy bit, and the method further involves repeating the method of 16 for each permutation of values of the at least one dummy bit.

In some embodiments, the method is repeated for each of a plurality of signal constellations to generate a respective plurality of shaped outputs for each signal constellation. Peak average power reduction is then performed by appropriate selection of a single shaped output from each respective plurality of shaped outputs.

Another broad aspect of the invention provides a multi-tone modulator having a signal generator adapted to generate signals for a respective signal constellation comprising a plurality of constellation points for each of a plurality of center frequencies; a constellation mapper adapted to define for each tone and for each permutation of values for M data elements, a respective set of at least one constellation point any one of which may be used to represent the permutation of values for M data elements thereby providing a choice of constellation points for the permutation of values for M data elements, with at least one said set of at least one constellation point having more than one constellation point; a peak average power reduction function (PAPR function) adapted to for each center frequency select a constellation point from the at least one constellation point mapped to by the constellation mapper which will result in a reduced peak average power ratio for the multi-tone signal, wherein the signal generate transmits using the constellation points selected by the peak average power reduction function.

Another broad aspect of the invention provides a modulator having shaping means for performing constellation shaping for each of a plurality of signal constellations a plurality of times to produce a respective plurality of shaped outputs; and peak average power reduction means for selecting a respective single shaped output from each plurality of shaped outputs such that a signal formed by combining the single shaped outputs has reduced peak power.

It is noted that other embodiments of the invention provide a computer readable medium ad/or processing platforms such as general purpose processors, custom processors, FPGAs, DSPs, ASICs adapted to implement any of the above summarized or below described methods/systems.

BRIEF DESCRIPTION OF THE DRAWINGS

Preferred embodiments of the invention will be described with reference to the attached drawings in which.

DETAILED DESCRIPTION OF THE PREFERRED EMBODIMENTS

According to an embodiment of the invention, in a multi-carrier system, a signal constellation is used which employs redundant constellation points for at least some combinations of data elements. The data elements may be bits but are not necessarily so. The multi-carrier system may for example be OFDM or other forms of multi-tone modulation.

For each carrier frequency of the multiple carriers, a respective signal constellation having a plurality of constellation points is defined. During each symbol period, one of the constellation points is transmitted on each of the multiple carriers.

Figure 2:
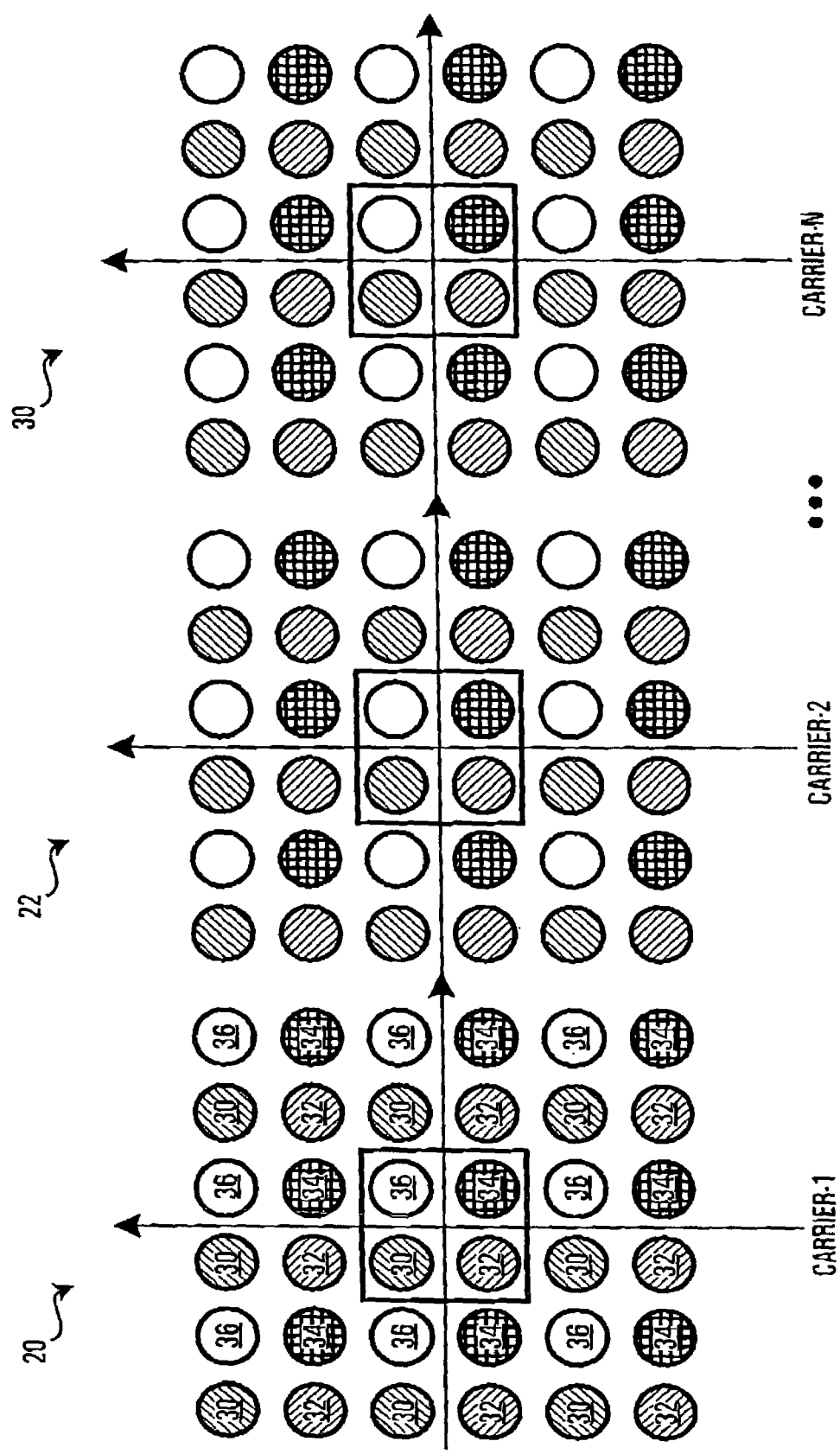
FIG. 2 shows an example of how 36 QAM can be used to reduce peak power using a method provided by an embodiment of the invention.

Referring to FIG. 2, an example is shown in which there are N carriers, and each carrier has an associated 36-QAM constellation. The first, second and Nth carriers having respective associated 36-QAM constellations generally indicated at 20, 22 and 30 respectively, the details of the third through N−1th not being shown. Each constellation point represents a pair of I and Q amplitude components transmitted at the carrier frequency. However, rather than mapping $\log_2 36$ bits (about 5.2 bits per symbol) to such a constellation per symbol for each carrier, a reduced number of bits per symbol are mapped, and in this example only two bits per symbol are mapped. Since only four constellation points are normally required to represent two bits, and since there are 36 constellation points available, it is possible to assign nine different constellation points of the 36 available constellation points for each two bit combination.

This is illustrated in the example of FIG. 2 by different shadings. In the constellation 20 for the first carrier, there are nine constellation points 30 having diagonal to the right stripes which have been allocated to represent a first of four possible permutations of two bits, nine constellation points 32 having diagonal to the left stripes which have been allocated to represent a second of four possible permutations of two bits, nine constellation points 34 having mesh fill which have been allocated to represent a third of four possible permutations of two bits, and nine constellation points which are shown in white which have been allocated to represent a fourth of four possible permutations of two bits. The constellations 22, 30 of the other carriers are similarly shown in FIG. 2. Any one of the nine constellation points can be used to represent the same two bits.

It is not necessary to define an equal number of constellation points to each pair of bits, but this is done in the preferred embodiments. It is also not necessary to have the constellation points used to represent a given pair of bits equally spaced as in the above example, but this is preferred as it gives maximum flexibility for reducing the peak power. It is of course to be understood that any constellation may be used for each of the N carriers, and they need not even be the same constellations. What is essential is that each constellation include some redundant mappings, and more generally, at least one constellation needs to include some redundant mappings. The larger the number of redundant mappings made available, the more easily the peak power will be reduced as described below.

For the example of FIG. 2, the multi-carrier signal will consist of a constellation point selected from the group of nine for the first carrier associated with the two bits to be transmitted on that carrier, plus a constellation point selected from the group of nine for the second carrier, and so on. There are thus $9^N$ different ways to represent the same 2N bit sequence.

Figure 1:
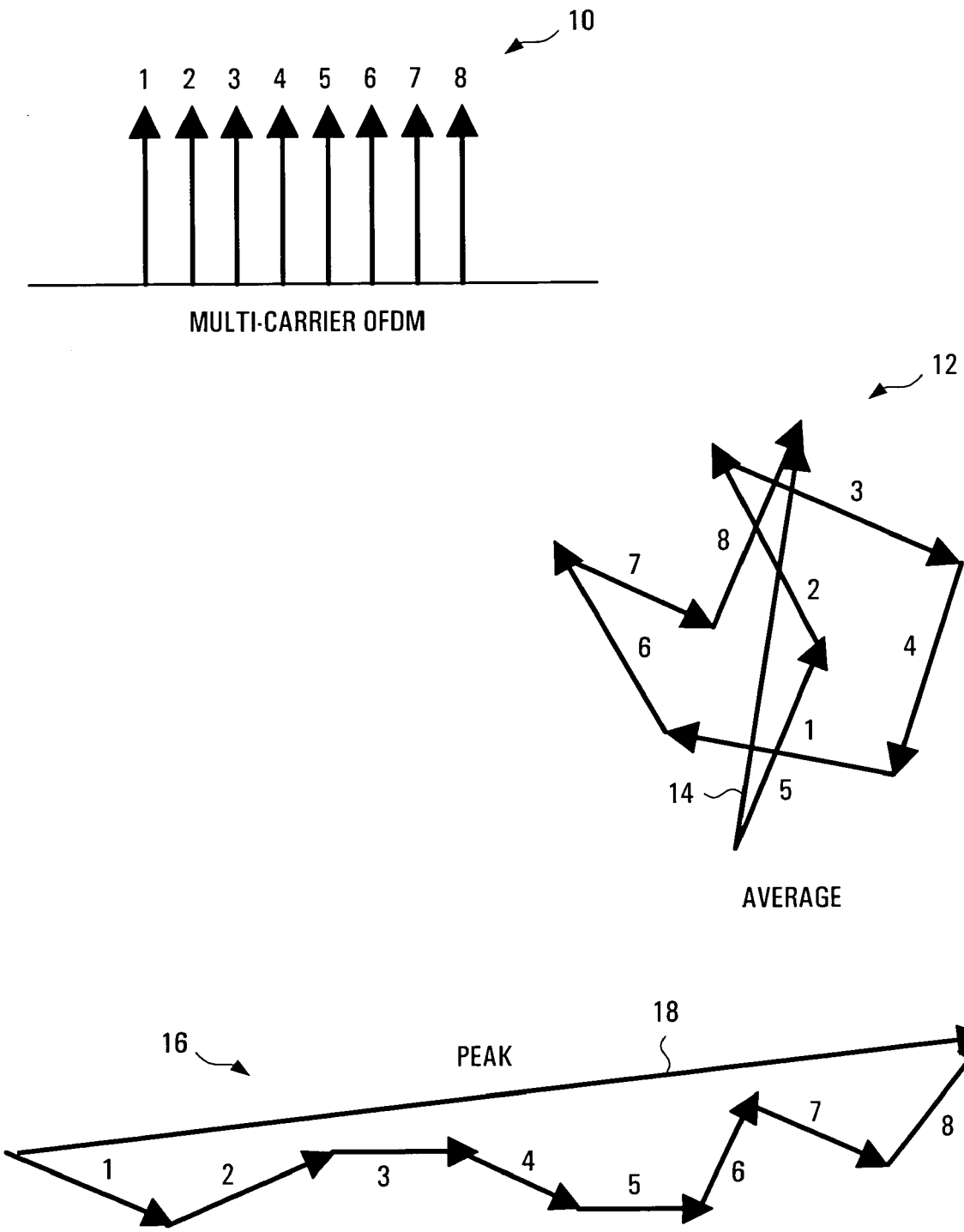
FIG. 1 is an example of how a high peak power may result with conventional multi-carrier modulation methods.

Referring back to FIG. 1, recall that the peak power transmitted for a multi-carrier signal at a given instant is determined by performing a complex addition of the complex amplitude of each of the carriers. For a given N bit sequence, if the constellations of FIG. 2 are used, then each of the possible $9^N$ different ways to represent the same N bit sequence will result in a respective different complex addition for the multi-tone signal, and will result in a different peak power. A particular representation is selected which will result in an acceptable and in most cases reduced peak power.

Figure 3:
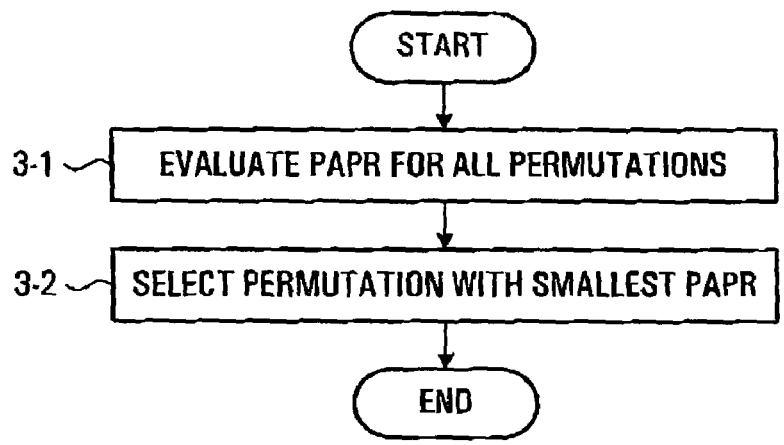
FIG. 3 is a flowchart of a first method of selecting constellation points which will result in a reduced PAPR (peak-to-average power ratio).

In a first embodiment shown in the flowchart of FIG. 3, where there is a choice of constellation points, a method is provided which involves evaluating the peak average power ratio for all the permutations (step 3-1) and then searching through all possible permutations of choices of constellation points for a set of constellation points which will result in the smallest possible peak average power ratio (step 3-2). In the above described example, this involves searching through all the $9^N$ different possibilities for the one which has the minimum peak power. In one implementation, this searching is done in real time, each time a given set of 2N bits is to be modulated. In another implementation, given that the answer will always be the same, then if 2N is sufficiently small, the search can be conducted a priori for each possible bit sequence of length 2N, and a table lookup produced mapping each 2N bit sequence to the corresponding permutation which results in the absolute minimum peak power possible.

In another embodiment, rather than searching for all possibilities, a predetermined threshold is established which represents an acceptable peak power. Searching is then conducted in real time for any of the possibilities which will satisfy this threshold. When a possibility is found which has a peak power which is less than the threshold, the searching is stopped.

Figure 4:
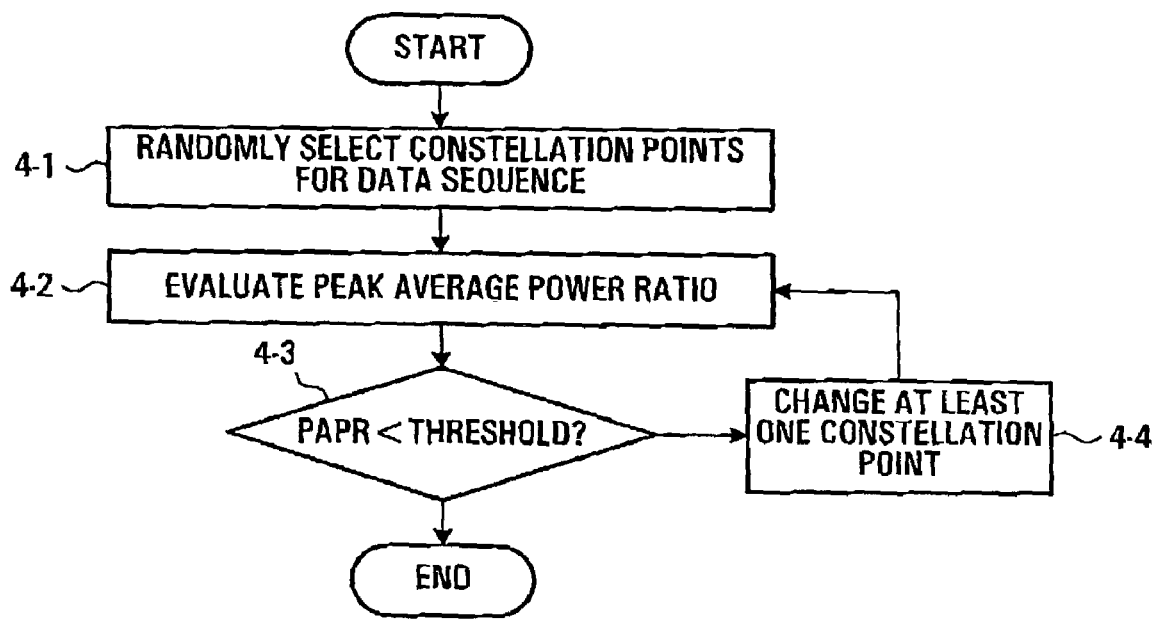
FIG. 4 is a flowchart of a second method of selecting constellation points which will result in a reduced PAPR.

Any suitable search technique may be used to hone in on an appropriate particular mapping for a given input which results in an acceptable peak power. One example searching technique is shown in the flowchart of FIG. 4. Searching for a combination of single constellation points in this example starts at step 4-1 with randomly selecting a constellation point from each particular respective plurality of constellation points. Next, at step 4-2, the peak average power ratio is evaluated using the randomly selected constellation points. In step 4-3, in the event the peak power ratio is less than the pre-determined threshold, the search is stopped. In the event the peak power ratio is greater than the pre-determined threshold, then at step 4-4, repeatedly, until the peak average power ratio is less than the pre-determined threshold, at least one of the randomly selected constellation points is changed to be a different constellation point in the particular respective plurality of constellation points to which the at least one of the randomly selected constellation points belongs and the peak average power ratio is re-evaluated This is repeated until the peak average power ratio is below the threshold.

OFDM Transmitter Structure with Constellation Shaping and Peak Average Power Ratio Reduction Algorithm A detailed example of the above described peak average power ratio reduction algorithm will now be described in the context of an OFDM transmitter. This embodiment also features a novel approach to constellation shaping.

Figure 5:
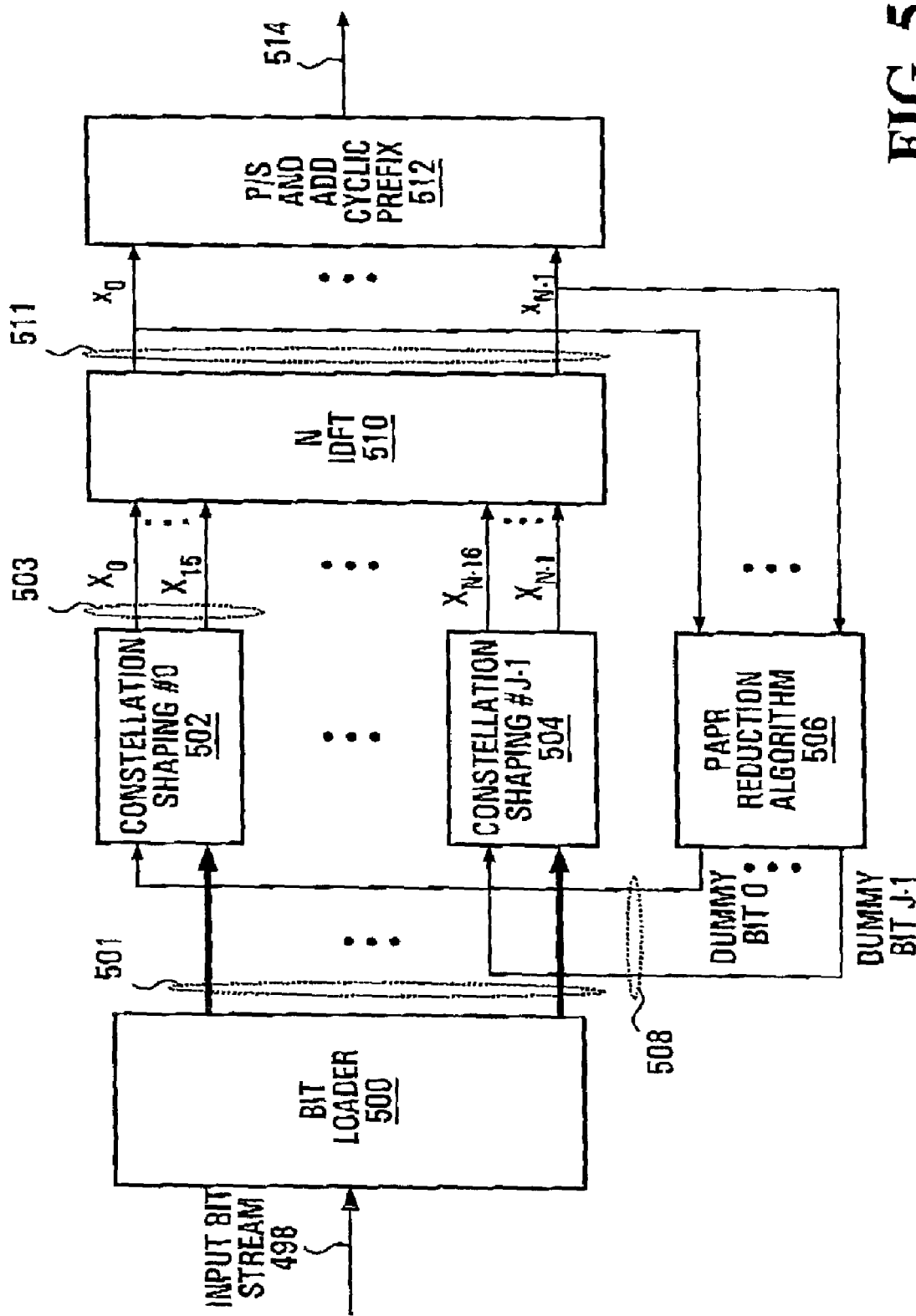
FIG. 5 is a block diagram of an OFDM transmitter structure with constellation shaping and PAPR reduction algorithm.

The OFDM transmitter structure provided by this embodiment of the invention is shown in FIG. 5. The transmitter has an input bit stream 498 which is input to a bit loader 500 where data bits are grouped into J groups generally indicated by 501. It is assumed that there are J different groups of sub-carriers. In FIG. 5, blocks 502, 504 represent constellation shaping algorithms which are performed for two of the J different groups of sub-carriers. Similar blocks are provided for the other groups of sub-carriers The input to each constellation-shaping algorithm 502, 504 is composed of two sets of bits, data bits (one of the J groups 501 formed by the bit loader 500) and one or more dummy bits produced by a PAPR reduction algorithm generally indicated by 506. The dummy bits produced by the PAPR reduction algorithm 506 are generally indicated by 508. The value of these dummy bits is determined by the PAPR reduction algorithm 506 as detailed below.

The output of the constellation-shaping algorithms 500, 502 define 2-D symbols for each of the respective group of sub-carriers. Further details are presented for the example in which there are 16 sub-carriers assigned to each of the J groups of bits in which case there are 16×J sub-carriers in total. For each group of sub-carriers, an independent constellation-shaping algorithm is used.

For this example, each constellation shaping algorithm defines a 2-D symbol for each of 16 sub-carriers. The output of the first constellation shaping algorithm 502 is indicated at 503, and the output of the last constellation shaping algorithm 504 is indicated at 505. The outputs of all the constellation shaping algorithms are input to an IDFT (inverse discrete Fourier transfer) function 510. Thus in this example, the input to the IDFT 510 is an N=16*J dimensional complex vector, where N represents the number of carriers (tones) used in the transmitter. Each carrier transmits a point from a 2-D QAM constellation.

Modulation is performed by the IDFT 510. The output of the IDFT 511 is passed through a parallel to serial converter 512 and a cyclic prefix is added to each OFDM symbol to generate the overall output.

The dummy bits 508 and data bits 501 are mapped to constellation points by using the constellation-shaping algorithms, which are described in detail below.

Constellation Shaping Algorithm

Shaping is a method for reducing the power required to transmit data relative to the power required for an unshaped (cube) constellation while keeping the minimum distance between constellation points the same. Shaping gain is achieved by using a larger constellation size compared to an unshaped constellation where the increase in constellation size is given by a constellation expansion ratio (CER). The CER is defined as the ratio of the number of points per 2-D of a shaped constellation to the minimum required number of points per 2-D to achieve the same overall rate in an unshaped constellation.

In the example structure of FIG. 5, an independent constellation-shaping algorithm for each 32-D vector (16-D complex dimensions) is provided. Each carrier transmits a 2-D point so a group of 16 2-D carriers represents a 32-D vector. Each such group will be referred to as a "frame" and each 2-D point will be referred to as a "symbol".

Figure 6:
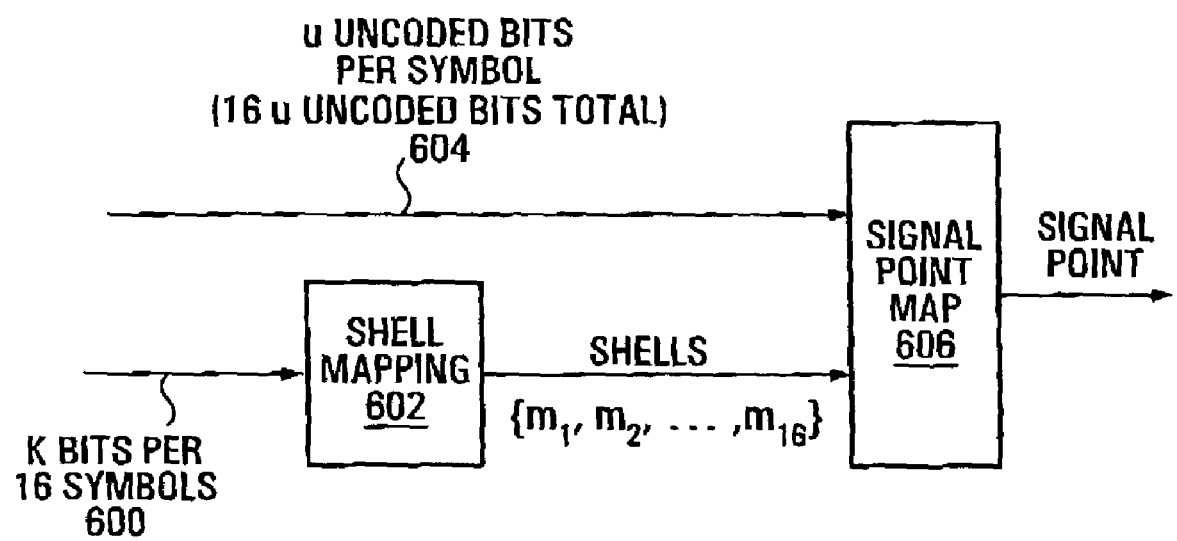
FIG. 6 is a simple block diagram of the constellation shaping algorithm of FIG. 5.

A very simple view of constellation shaping is shown in FIG. 6. As detailed below, each constellation is divided into M rings or shells of symbols. A shell number defines such a shell, and a point in the shell define a symbol. For example, for each frame, K shaping bits 600 can be mapped into sixteen shells $\{m_1, m_2 \ldots m_{16}\}$ with a shell mapper 602 and u uncoded data bits 604 per symbol select a point in each shell with signal point map 606. The dummy bit produced at the output of the PAPR reduction algorithm 506 of FIG. 5 is used as one of the K shaping bits 600. Let B be the number of bits sent per shaping frame. It can be seen that B=K+16u since there are 16 symbols per frame. The role of the shell mapping 600 is to select one of the 16 shells for each of the 16 sub-carriers. Then, for each of the rings thus selected, u uncoded bits select a particular point within the shell.

Let M be the number of shells per symbol, in other words the number of shells the constellation is divided up into. The number of constellation points L used for a symbol is then given by $L=M \times 2^u$. The CER can be determined (actual number of constellation points per symbol)/(minimum number of constellation points per symbol). Since each symbol carries u data bits +K/16 shaping bits, the minimum constellation size is $2^{u+K/16}$. The actual constellation size is $M \times 2^u$. Thus the CER is $$\frac{M \times 2^u}{2^{u+K/16}} = \frac{M}{2^{K/16}}.$$

In a preferred embodiment, M is chosen such that a CER per 2-D is at least 1.35, which gives $M \geq 1.35 * 2^{K/16}$.

As an example, the minimum values of M to achieve a CER of 1.35 for various values of K are shown in Table 1.

TABLE 1

| Different K and M values | |
|---|---|
| K | $M \geq 1.35 * 2^{K/16}$ |
| 25 | M ≥ 3.99 |
| 41 | M ≥ 7.97 |
| 57 | M ≥ 15.95 |

The L constellation points for a symbol are ordered as follows: Shell 0 contains the $2^u$ least-energy points, shell 1 contains the $2^u$ next lowest energy points, and so forth up to shell M−1. A cost $c_i$ is assigned for each shell i, which is proportional to the average power of the points in the shell i.

Various tree structures for mapping the K shaping bits to the rings (the shell mapping 602 of FIG. 6) can be employed. Next, two different examples of the tree structures which may be employed will now be presented one based on the Huffman tree and the other based on a Fixed tree.

Huffman Tree

Figure 7A:
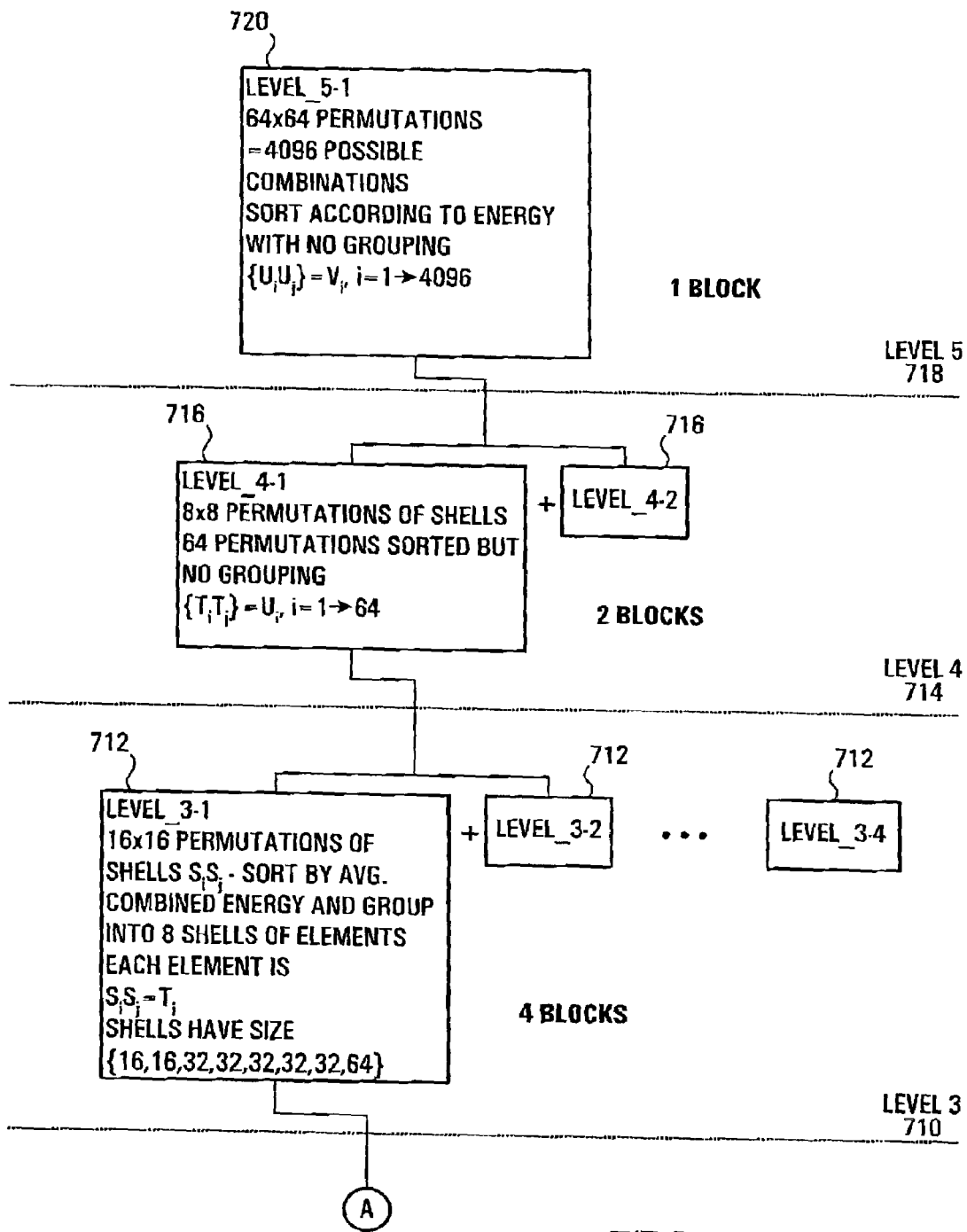
FIGS. 7A, 7B and 7C provide a breakdown of how addressing may be performed within one constellation-shaping algorithm of FIG. 5.
Figure 7A:
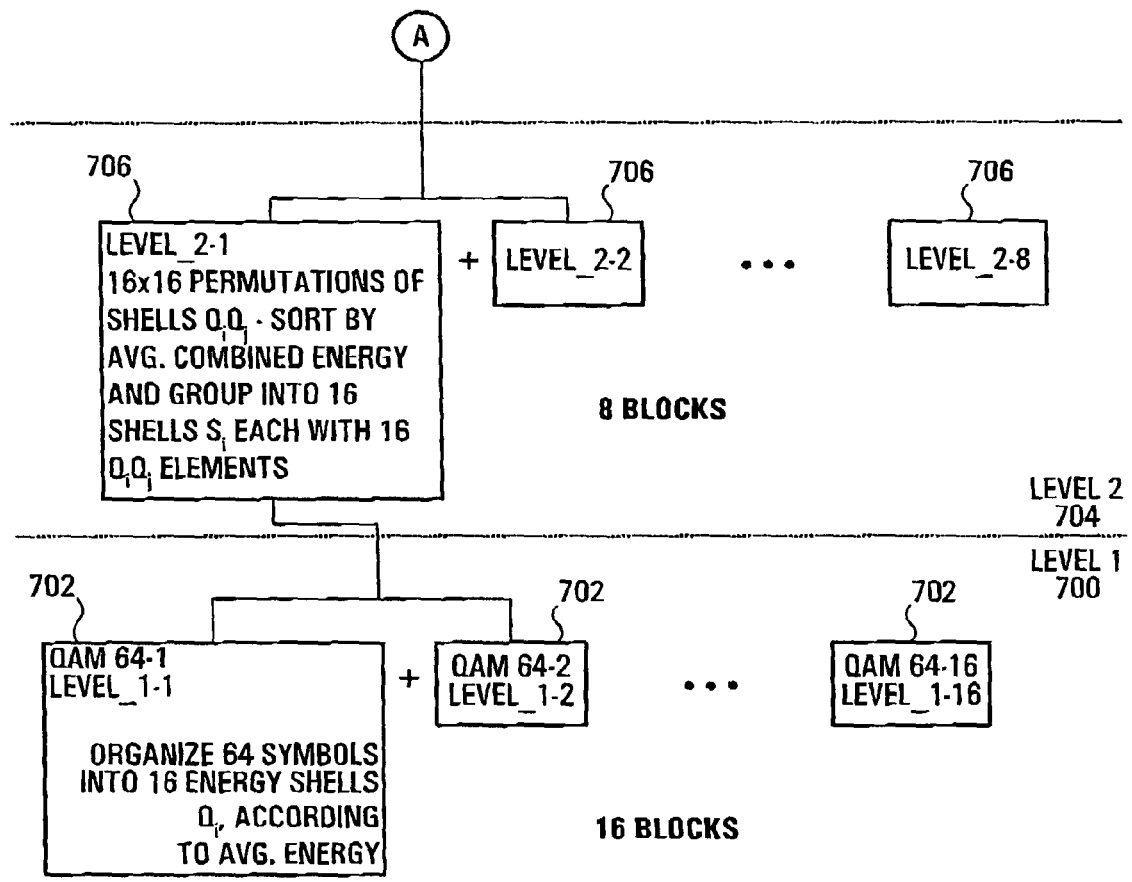

An example will be presented in the context of using a QAM-64 constellation for each sub-carrier. Mapping is performed with "level 1" at the bottom and "level 5" at the top. Referring to FIG. 7A, level 1 generally indicated at 700 is made up of 16 blocks 702 where each block represents one transmitted symbol and a symbol is a point from a QAM-64 constellation. The blocks are labeled QAM64-1 (Level_1—1), . . . , QAM64-16 (Level_1–16). The 64 available points for each 2-D symbol are sorted in a non-descending order according to their energy and grouped into 16 rings each with 4 points each. (Ring 0 is composed of 4 points with the least energy and ring 15 is composed of 4 points with the largest energy). The energy of a ring is the average energy of the 4 points in that ring. Each ring for a given block at level 1 is $Q_i$, i=0, . . . , 15.

Level 2 generally indicated at 704 is made up of eight blocks 706. Two adjacent level 1 blocks are combined to form one level 2 block. Each element in a level 2 block has pointers to two rings in different blocks at level 1. In other words, each element at level 2 is $Q_i Q_j$ for some i,j. As at level 1, the elements of each block of level 2 are organized into has 16 rings. Since there are 256 possible different combinations of level 1 rings, each level 2 block has 256 elements. The energy of each element at level 2 is the average energy of the two rings at level one, which level 2 element is pointing to. Again, these 256 elements are sorted according to their energy and grouped into 16 shells each with 16 elements. (Shell 0 is composed of 16 elements with the least energy and shell 15 is composed of 16 elements with the largest energy). This defines sixteen shells $S_i$, i=0, . . . , 15 for each level_2 block each containing sixteen $Q_i Q_j$ combinations.

Level 3 generally indicated by 710 is made up of 4 blocks 712. Two adjacent level 2 blocks 706 are combined to form one level 3 block 712. Each element in a level 3 block has pointers to two shells in different blocks at level 2. In other words, an element of Level 3 is $S_i S_j$ for some i,j. There are 256 possible different combinations of level 2 shells, so each level 3 block has 256 elements. The 256 elements are sorted according to their energy and grouped into 8 shells $T_i$, i=1, 8. To reduce the addressing complexity, the merging at this stage is achieved using non-equal number of elements. A specific example with very good performance is to select the shells to have sizes of {16, 16, 32, 32, 32, 32, 32, 64}. Elements with the least energy are placed in smaller size shells. Shell 0 is composed of 16 elements with the least energy and shell 7 is composed of 64 elements with the largest energy. Thus eight shells $T_i$, i=1, 8 are defined for each level 3 block, each containing a variable number of $S_iS_j$ combinations.

Level 4 generally indicated at 714 is made up of two blocks 716, where two adjacent level 3 blocks 712 are combined to form one level 4 block 716. Each element of a level 4 block has pointers to two shells in different blocks at level 3. Since at level 3 each block has 8 shells, there are 64 possible different combinations of level 3 shells, so each level 4 block has 64 elements $T_iT_j$ for any i,j. Elements are sorted according to their energy but no grouping is performed at level 4. Thus, level four has 64 elements $U_i$ sorted according to energy.

Level 5 generally indicated at 718 is made up of a single block 720, which is formed by the two level 4 blocks 718. Each element of the level 5 block has pointers to two elements in different blocks at level 4. Since in level 4, each block has 64 elements, there are 4096 possible different combinations of level 4 elements $U_iU_j$ for any i,j, and thus the level 5 block has 4096 elements. Level 5 elements are sorted according to their energy without doing any grouping to produce a set of level 5 element $V_i$, i=1, . . . , 4096.

In the absence of shaping, 12 bits are required to select one element at level 5. Shaping gain is achieved by mapping fewer than 12 bits to level 5 such that there is redundancy in the points mapped to a given set of bits. A subset of level 5 elements is selected with the least energy.

From an input consisting of a set of R bits, the first x-bits are used to select an element at level 5. 12 bits are required to select an element, but to achieve shaping gain, fewer than 12 are used. Preferably, 7, 8 or 9 bits are used to select the level 5 element.

Each element at level 5, points to two elements at level 4, and each element at level 4 points to 2 shells at level 3. Thus, the selected element at level 5 points to 4 shells at level 3. There is no grouping at level 4 so no additional bits are required to select level 4 elements. An element is to be selected in each shell at level 3 to go down to level 2. Since the number of elements in each shell is not the same, a variable number of bits from the input at level 3 needs to be read. In order to select an element from a shell of size 16, 32 or 64, 4, 5 or 6 bits are required respectively. Thus, 4, 5 or 6 bits from the input are read to select an element in a shell for each block at level 3 (according to its size).

Each selected element at level 3 points to two shells at level 2 where each shell has 16 elements. An element needs to be selected in each shell at level 2 to go down to level 1. For each block at level 2, 4 bits are read from the input to select one of 16 elements in a shell. The selected element at level 2 points to two rings at level 1 where each ring has 4 points. 2 bits are read from the input to select one of 4 points in a ring at level 1.

Let $R_n$ be the number of bits needed to be read from the input to go down from level n to level n−1, n=1 to 5. At level 1, for each block a point is to be selected from a set of 4 points, which requires 2 bits per block. As there are 16 level 1 blocks, $R_1$=16*2=32. At level 2, for each block an element is to be selected from a set of 16 elements, which requires 4 bits per block. As there are 8 level 2 blocks, $R_2$=8*4=32. The number of bits required at level 3 varies, as shell sizes at this level are not same. $R_3$ may vary between 16 (which corresponds to each shell having 16 elements in all level 3 blocks) and 24 (which corresponds to each shell having 64 elements in all level 3 blocks). $R_4$ is zero as no grouping is performed at level 4. $R_5$ is selected to vary such that the total number of bits used in addressing is fixed and the sum of $R_n$, N=1 to 5 is the size R of the input.

Lets assume level 5 has $2^x$ number of elements, and so x-bits are used to select a single element at level S. This subsequently gives pointers to two level 4 elements, note that no bits are required at level 4. From level 4 down, pointers are giving reference to shells, so a certain number of bits are required to select an element within that given shell. The bits required depend on the size of the shell. Since level 3 shell sizes vary, the bits used at this level are not constant, so each shell must specify the bits required and grab them from the input accordingly. Level 2 and 1 has fixed shell size of 16, hence 4 bits are needed for selection. It is required that the total number of bits used for the signal constellation be a constant value, and because bits required at level 3 vary, a method must be introduced to adjust the bits used at the top level selection so that the sum of bits is always constant.

Suppose at the top level, there are a possible total of I (=4096) elements and a subset of size i is required to accommodate a fixed total of R input bits. This means only i out of I elements are used. The selection of a value for i is determined by experimentation, with different values attempted until R=size of input, K=number of shaping bits are both integers. In this example, as will be explained, with an input of 121 bits, 57 of which are used as shaping bits, i=194 of the 4096 elements are required. Please note that R=K+16u, so u=4 meaning four information bits are used to select a point from the 16 element level 1 shell In order to determine the appropriate i, K is computed as $$K = \log_2\left[\sum_{n=1}^{i} 2^{R'_n}\right]$$

where $R'_n$ is the required number of shaping bits to go down the tree from the top element n, then $K-R'_n$ is the number of bits used at the top level to select element n.

Figure 7B:
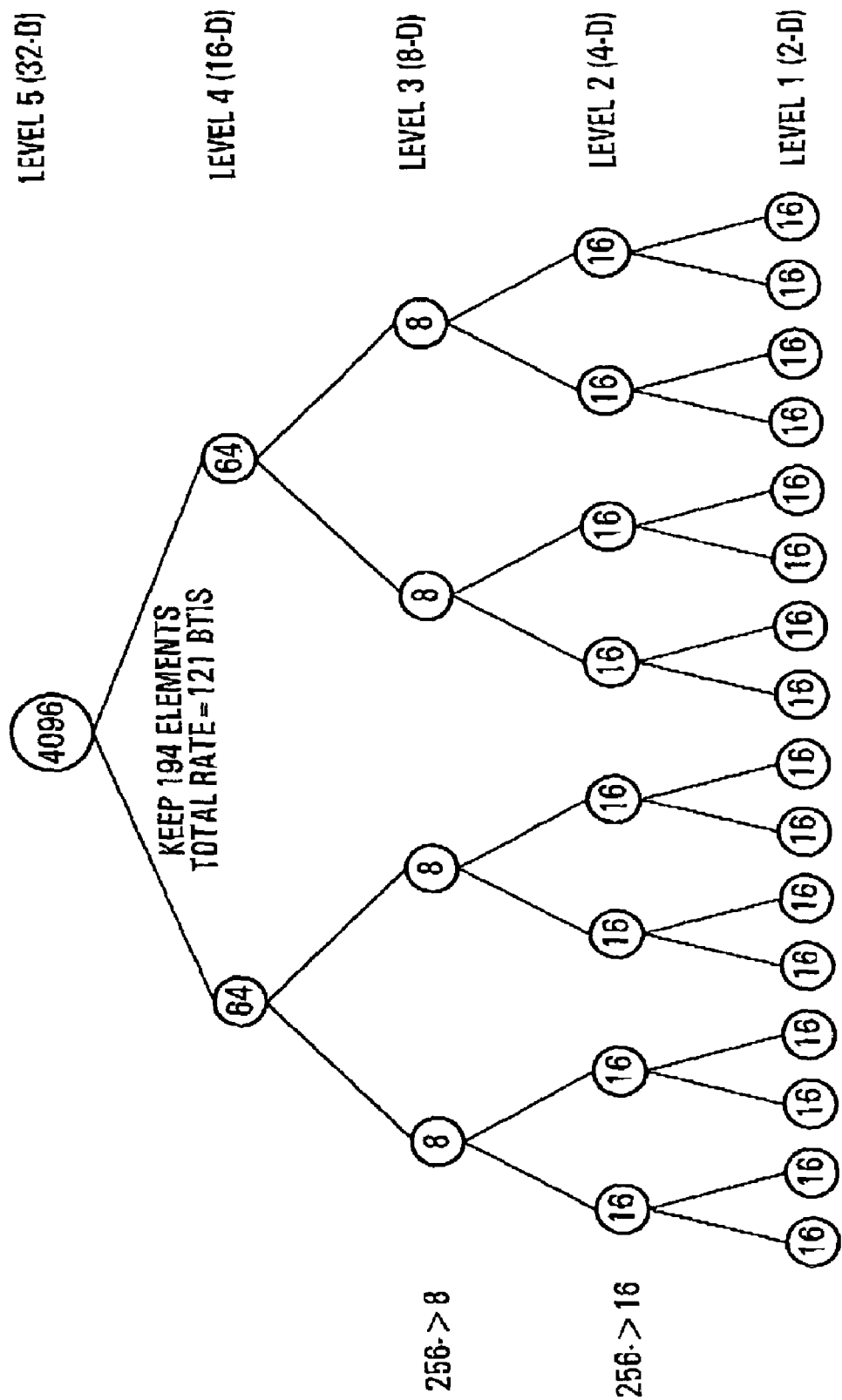
Figure 7C:
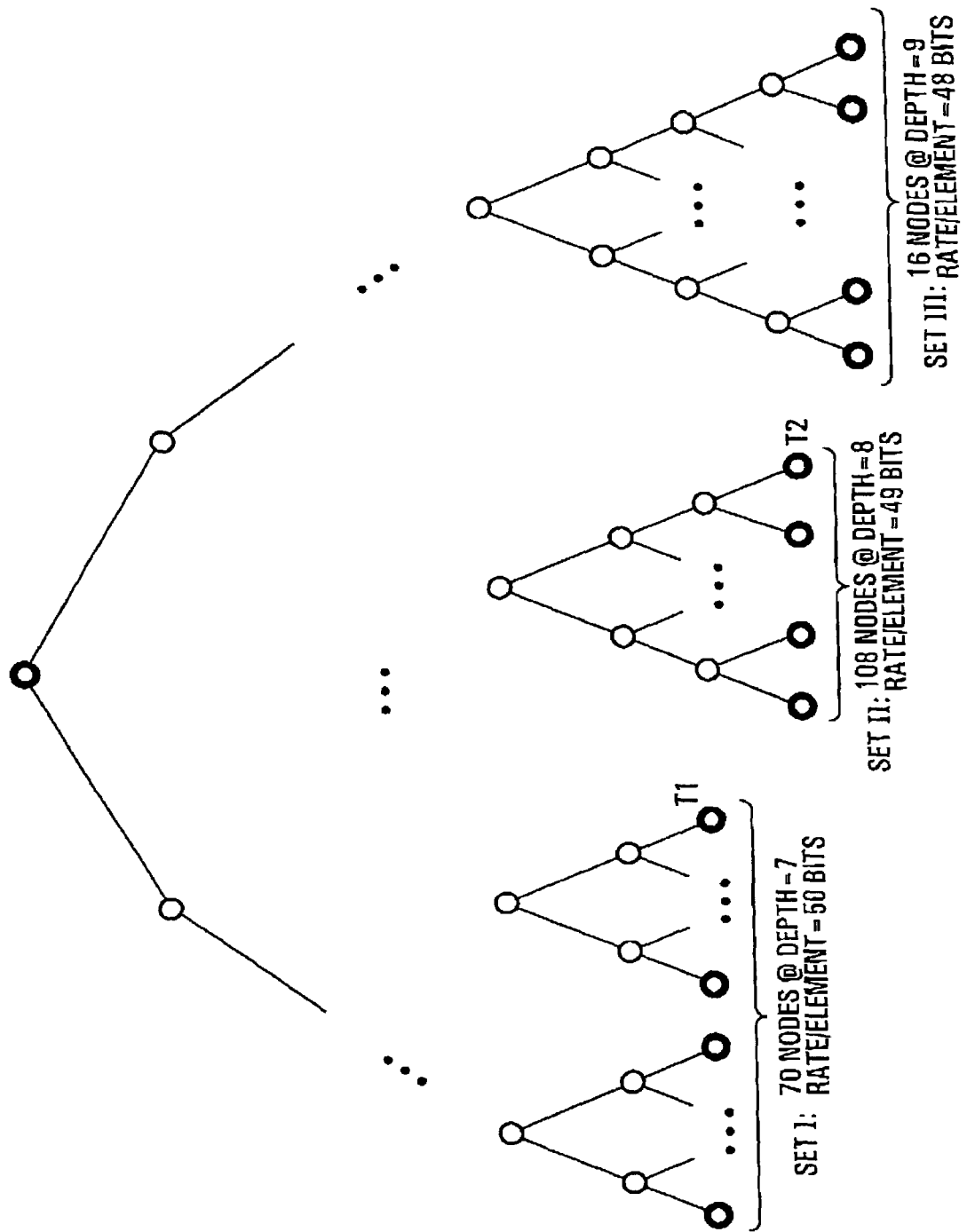

FIG. 7C is an example Huffman tree structure used for addressing, and FIG. 7B shows the tree structure of the hierarchy used for addressing. FIG. 7C shows the total of 194 elements out of 4096 possible elements. The first 70 are used with 7 bit addressing at level 5. 54 of the remaining 58 7 bit addresses are used as the first 7 bits of eight-bit address, with 54×2=108 possible 8 bit level 5 addresses. The remaining 4 of 58 7-bit addresses are used as the first 7 bits of 9 bit addresses with 4×4=16 possible 16 bit level 5 addresses. Thus we have $R'_n$=48, 49, 50 and (70*2^(50))+(108*2^(49))+(16*2^(48))=2^(57)=$2^R$=number of shaping mappings possible.

As indicated above, different values of i are computed until R and K turn out to be integers. Furthermore, R and K should be selected to provide the required value of CER, say, $$\frac{256}{2^{R/16}} \cong 1.35$$

Let b=K−$R'_n$, then b ∈ {$b_1$, . . . , $b_j$=$b_1$+j−1} where $b_1$ is the smallest value of b and j is the number of different values that b can take on. Top-level elements in the subset are grouped according to the value of b Then a code can be assigned to each element using a Huffman tree structure. Elements, having value starting from $b_1$ to $b_j$, are placed at different levels at the bottom of the tree from left to right. Each element will be placed in the tree with exact height of b, meaning that it can be represented by a code of length b. This is equivalent to assigning code from a first set of elements from 0 to $s_1-1$ for elements with $b_1$, $s_1$, $s_2$ ... $s_j$ are the total number of elements in respective sets with the value of $b_1$, . . . , $b_j$ respectively. For elements with $b_2$, one least significant bit is added so code will start from $2 \times s_1$ to $2 \times s_1 + s_2 - 1$. Similarly, elements with $b_3$ starts from $2 \times (2 \times s_1 + s_2)$ to $[2 \times (2 \times s_1 + s_2)] + s_3 - 1$ and so on.

One of the optimum configurations for the level 3 shells is (16, 16, 32, 32, 32, 32, 32, 64) (refer to FIG. 7C). It is found that to transmit R=121 bits, i should be 194. Within the subset of i elements, there are only j=3 different values of b and they are 7, 8 or 9. Hence at level 5, there are 194 elements separated into 3 sets and the specified element can be located through arithmetic manipulation. At level 4, there are two blocks each contains 64 elements. Finally, all blocks in level 3 to level 1 each has 256 elements, only the shell groupings vary.

Thus at level 5, only a subset of the 4096 elements required to map the input are selected. In this example, since 7, 8 or 9 bits will be used at level 5, only the first 194 elements out of 4096 elements are required, these being the 194 elements at level 5 with the smallest energy. These 194 elements are based on the number of bits they require at level 3. The 194 elements are comprised of three sets, Set 1, Set 2 and Set 3 of sizes $S_1=70$, $S_2=108$ and $S_3=16$ with $R_3$ values of 18, 17 and 16 bits respectively. Thus $R_5$ must be 7, 8 or 9 for Set 1, Set 2 or Set 3 respectively to have a total of 25 bits used in $R_3$ and $R_5$.

The Huffman tree structure is then used for addressing levels 3, 4 and 5. 7 bits are read from the input. If the value of 7 bits is less than 70, an element in Set 1 is chosen. As all the elements in Set 1 requires 18 bits at level 3, $R_3 + R_5 = 25$ bits is satisfied.

If the value of 7 bits is greater than or equal to 70, another bit is extracted from the input and the value of 8 bits is compared to 248. If the value of 8 bits is less than 248 an element in Set 2 is chosen. If not, one more bit is extracted from the input and an element in Set 3 is chosen based on the value of 9 bits. As a result, we end up with an algorithm which maps fixed number of input bits to 16 rings for a frame.

For further clarity, the explanation of the above example is presented in the following in a different way. Assuming 16 shells in 2-D sub-spaces, there are 16×16=256 elements in the Cartesian product of the 2-D sub-constellations in 4-D sub-spaces. The 4-D elements are ordered according to their average energy, and 16 subsequent elements are merged into a 4-D shell. This results in 16 shells of equal cardinality in the 4-D sub-spaces. Again, the Cartesian product of the 4-D shells (resulting in 256 elements in each 8-D sub-space) are ordered according to their average energy and subsequent elements are merged into 8-D shells. To reduce the addressing complexity, the merging at this stage is achieved using non-equal number of elements in subsequent 8-D shells. In specific, the number of elements (in the order of increasing average energy) merged into subsequent 8-D shells are equal to {16, 16, 32, 32, 32, 32, 32, 64}, respectively. This results in 8 shells in 8-D sub-spaces. Following that, we obtain 64 elements in the 16-D sub-spaces (which are not merged) and 4096 elements in the 32-D space (which are not merged).

Note that the cardinalities of the 16-D and 32-D elements are not equal (these cardinalities are all an integer power of two). The final constellation is selected from the 32-D elements of least energy such that the overall bit rate is 57. Note that without shaping, the bit rate would be 16×4=64. This means that the shaping redundancy is equal to 7 bits/32-D, resulting in, $$CER = 16/(2^{57/16}) - 1.35$$

The addressing at the highest level of the hierarchy is achieved using a Huffman tree as shown in FIGS. 7B, 7C. The first step is decide if the selected 32-D element belongs to Set I, Set II or Set III. This is achieved by assuming that the 194 elements are labeled by the binary number obtained by assigning zero to the left branch and one to the right branch at each node of the tree. Then, the label of each final node (corresponding to a element) is obtained by concatenating the binary labels of its branches (where the most significant bits correspond to values closer to the top of the tree). This will result in the labels of the final nodes to be ordered increasingly from left to right. Note that the label of the final nodes are composed of 7 bits (for Set I), 8 bits (for Set II), and 9 bits (for Set III). In this case, to select a 32-D element, we extract 7 bits from the input stream and compare its numerical value with the threshold T1 which is the label of the last element in Set I. If the label is smaller or equal to T1, then we are within Set I, and will have another 57−7=50 bits to proceed with the addressing within the selected element. Otherwise, we extract one more bit from the input stream, resulting in an 8 bit label. We compare the numerical value of the resulting 8-bit label with the threshold value T2 which is the label of the last node in Set II. Again, if the label turns out to be smaller or equal, we proceed with the addressing within Set II using the remaining bits (in this case, 49 bits are left). If the label turns out to be larger than T2, then we extract one more it from the input stream and use the resulting 9 bits to select an element within Set III (in this case, we are left with 48 bits to select an element within Set III).

After selecting one of the 194 elements in 32-D (as explained above), to proceed with the addressing within the selected element, a look-up table is provided with 194 memory locations each of 4×3=12 bits, where the 3-bit address sections point to the 8-D shells building a given 32-D element (note that each 32-D element is simply the Cartesian product of four 8-D shells). This results in 194× 12=2328 bits of ROM.

To proceed with the addressing within 8-D shells, we note that the selected 8-D shell is composed of 16, 32, or 64 of 8-D elements (corresponding to 4, 5, 6 bits, respectively). In this case, we extract another 4, 3 or 2 bits from the input (for each 8-D sub-space) to bring the total number of bits per 8-D to 8 bits. We use these 8-bit addresses to select an 8-D element in each 8-D sub-space. To do this, a look-up table is provided with 256 memory locations each of 4×2=8 bits, where each 4-bit section of these 8-bit addresses points to the 4-D shells constructing a given 8-D element. These bits are used to select one 4-D shell in each 4-D sub-space.

To proceed with the addressing within 4-D shells, a look up table is provided of 256 memory locations each of 4×2=8 bits, where each 4-bit section of these 8-bit addresses points to the 2-D shells construing a given 4-D element. These bits are used to select one 2-D shell in each 2-D sub-space. As mentioned before, there will be another group of input bits (depending on the number of signal points within each 2-D shell) which will be used to select the finally point within each 2-D sub-constellation. This finalizes the addressing.

The total memory requirement for the proposed addressing scheme is equal to:

$$M_{total} = 2328 + 2048 + 2048 = 6424 \text{ bits} \sim 0.73 \, K$$

Note that the elements in the Cartesian product always happen in pair (of equal energy), say A×B and B×A, unless the two constituent lower dimensional components are the same, say A×A. This property can be used to reduce the size of the required memory by a factor of close to two at the price of a very small number of comparisons (comparing the labels to some anchor points corresponding to the label of the elements with identical components). Simulation results show that the proposed constellation offer a shaping gain of about 1 dB.

As a specific example, assume that each 2D sub-constellation is composed of 256 points divided into 16 shells each of 16 points. The input is composed of a total of 57 shaping bits plus another 64 bits. The 57 shaping bits are involved in the selection of 2-D shells through the proposed addressing scheme and will be used to select a unique 2-D shell in each 2-D sub-constellation. The remaining 64 bits will be divided into 16 parts each of 4 bits and each of these 4 bits will be later used to select a unique point among the choices available in each of the chosen 2-D shells. We are only concerned with the operation of the selection of the 2-D shells using the 57 shaping bits. The selection of the final 2-D points within those 2-D shells is a trivial task. The same procedure will apply to any other scenario where the number of 2-D points is different from 256 while the number of 2-D shells is 16. For example, if the 2-D sub-constellations are composed of 64 points, we would have 16 of the 2-D shells each with 4 points and the total number of input bits would be 57 (for shaping) plus 32 bits for the selection of the final 2-D points (the addressing procedure for those 57 shaping bits would be exactly the same for all such cases of scaling the 2-D sub-constellations). In the following, we assume that the 2-D sub-constellations are composed of 256 points. There are 57+64=121 input bits and we select the first 57 of those for the addressing (shaping bits). Let us consider the following cases for the 57 shaping bits;

Case I: 0010010

The first 7 bits are 0010010 with the value of 18 that is less than T1=69. In this case, the selection will be within Set I in FIG. 7C. This value of 18 will point to a location in the corresponding look up table which contains 4 pointers each of 3 bits specifying the related 8-D elements (there are 4 of these 8-D elements). After knowing the 8-D elements, we proceed with the addressing within each of those 8-D elements by extracting an appropriate number of bits from the remaining input bits in a sequential manner and using those bits to select their related elements within the 4-D and subsequently 2-D sub-spaces by referring to the related look-up tables used for the addressing within 4-D and 2-D sub-spaces.

Case II: 1010010 0 100100

The first 7 bits are 1010010 which is equal to 82 and is greater than T1=69. To proceed, we extract one more bit from the input which is equal to 0. Then, the first 8 bits, namely, 10100100 with the value of 164 is compared to T2=247. As the label is smaller than T2, then we are within the Set II. In this case, we are left with 49 shaping bits to proceed with the selection of the 8-D elements.

Case III: 1111011 1 100100

The first 7 bits are 1111011 with the value 123 which is larger than 69 and the first 8 bits, namely 11110111 are of value 247, so we are within Set II and we use the first 8 bits for the addressing in Set II.

Case IV: 1111110 1 100100

The value of the first 7 bits is larger than T1=69 and the value of the first 8 bits is larger than T2=247, so we are with Set III and we extract the first 9 bits for the addressing with Set III.

Fixed Tree

An example of a fixed tree implementation will now be given. A fixed tree refers to the situation where the merging of elements at all levels of hierarchy is achieved in a uniform manner (equal number of elements are merged into shells). This results in a higher memory size while smaller number of computations are needed to search the corresponding memory lookup tables. The Fixed tree has the same structure as the Huffman tree for level 1 and level 2. Level 3 is made up of 4 blocks. Two adjacent level 2 blocks are combined to form one level 3 block. Each element in a level 3 block has pointers to two shells in different blocks at level 2. As at level 2, each block has 16 shells, there are 256 possible different combinations of level 2 shells, so each level 3 block has 256 elements. 256 elements are sorted according to their energy and grouped into 16 shells each with 16 elements.

Level 4 is made up of 2 blocks, where two adjacent level 3 blocks are combined to form one level 4 block. Each element at level 4 block has pointers to two shells in different blocks at level 3. As at level 3, each block has 16 shells, there are 256 possible different combinations of level 3 shells, so each level 4 block has 256 elements. 256 elements are sorted according to their energy and grouped into 128 shells each with 2 elements.

Level 5 is made up of a single block, which is formed by the two level 4 blocks. Each element at level 5 block has pointers to two elements in different blocks at level 4. As at level 4, each block has 128 shells, there are 16384 possible different combinations of level 4 shells, so the level 5 block has 16384 elements. Elements are sorted at level 5 according to their energy without doing any grouping.

From an input of 89 bits, the first 7 bits are used to select an element at level 5. As 7 bits can choose 128 different elements, at level 5 only first 128 elements are used. Each element at level 5 points to two shells at level 4. At level 4 an element needs to be selected in each shell to go down to level 3. For each block at level 4, 1 bit is read from the input to select one of 2 elements in a shell. The selected element at level 4 points to two shells at level 3 where each shell has 16 elements. For each block at level 3, 4 bits are read from the input to select one of 16 elements at level 3. The selected element at level 3 points to two shells at level 2 where each shell has 16 elements. Again, for each level 2 block, 4 bits are read from the input to select one of 16 elements at level 2. The selected element at level 2 points to two rings at level 1 where each ring has 4 points. For each block at level 1, 2 bits are read from the input to select one of 4 points in a ring at level 1.

The total number of bits read from the input at each level is as follows. 7 bits at level 5, 2*1=2 bits at level 4, 4*4=16 bits at level 3, 8*4=32 bits at level 2 and 16*2=32 bits at level 1 which gives a total of 89 bits.

Different Fixed tree structures are possible. Table 2 shows a different one, which has 4 rings at level 1.

TABLE 2

Two possible Fixed tree structures

| | Fixed Tree Structure 1 | | | Fixed Tree Structure 2 | | |
|---|---|---|---|---|---|---|
| | # of shells | # of points in each shell | # of bits read | # of shells | # of points in each shell | # of bits read |
| Level 1 | 16 | 4 | 2 × 16 = 32 | 4 | 16 | 4 × 16 = 64 |
| Level 2 | 16 | 16 | 4 × 8 = 32 | 16 | 1 | 0 × 8 = 0 |
| Level 3 | 16 | 16 | 4 × 4 = 16 | 16 | 16 | 4 × 4 = 16 |
| Level 4 | 128 | 2 | 1 × 2 = 2 | 128 | 2 | 1 × 2 = 2 |
| Level 5 | 16384 | 1 | 7 × 1 = 7 | 16384 | 1 | 7 × 1 = 7 |

PAPR Reduction Algorithm

The previously described PAPR algorithm can now be adapted for use with the above described constellation shaping algorithms. Referring again to FIG. 5, the output of each constellation-shaping algorithm 502, 504 is a 32-D vector generated from B bits. In this embodiment, these B bits consist of B−1 data bits taken from the input bit stream, and one dummy bit 508 selected by the PAPR algorithm 506. As the dummy bit is either 0 or 1, addressing of B bits is performed by the constellation shaping algorithms 502, 504 twice, corresponding to dummy bit being equal to 0 or 1. This yields two choices for each 32-D vector. For an OFDM system, which uses N tones, the input to the modulator is generated by concatenating J 32-D vectors such that J*16=N as each carrier transmits a 2-D point. For each of J 32-D vectors, we can choose one from a set of 2, so 2N-D vector can be generated in $2^J$ different ways depending on the values of dummy bits. Thus, the purpose of the PAPR reduction algorithm 506 in this context is to choose the 2N-D vector from a set of $2^J$ vectors, which yields the lowest peak magnitude after modulation. In general, $2^J$ is a large number which makes exhaustive search prohibitive due to its high computational complexity.

These two choices per constellation are analogous to the multiple choices (9) per constellation discussed with reference to FIG. 2. In this example, one dummy bits are employed resulting in two choices per constellation. More generally, a larger number of dummy bits may be employed resulting in a larger number of choices. However, this requires a larger search to find the particular permutation with the lowest peak power.

In one embodiment, an iterative search algorithm is employed to select between the two choices for each of J 32-D vectors. Initially the value of the dummy bit for each 32-D vector is set such that 2N-D vector has the lowest energy. Note that the lowest energy property does not imply that after modulation the lowest peak magnitude will result. Next, starting from the first 32-D vector, the value of dummy bit is flipped, (i.e. select the other choice for the first 32-D vector), while keeping the values of other dummy bits as before. Modulation is performed, and the peak magnitude calculated. The new value of the dummy bit is kept it there is a reduction in the peak magnitude and rejected otherwise. This procedure is repeated for all J 32-D vectors for several iterations.

The iterative search algorithm is not optimal because there is no guarantee that the obtained result gives the global minimum for the peak magnitude. Starting from a different initial condition or performing the search algorithm in a different way in general will yield a different result. A way to improve the performance of the algorithm is to obtain multiple solutions by starting from the same initial condition but changing the search pattern. A first solution can be obtained by starting from the first 32-D vector and changing the dummy bit for the first, second, third etc. 32-D vector. Another solution can be obtained by starting from the J−$1^{th}$ 32-D Vector and move in a descending way, i.e. by changing the dummy bit for the J−$1^{th}$, j−$2^{th}$ etc. 32-D vector. Different search patterns can be employed which come up with different solutions. Finally, the solution is selected which gives the least peak magnitude out of the obtained ones.

Results

Simulation results have been obtained for N=1024 carriers where each carrier transmits a point from a 64 QAM. Simulation results have been obtained by transmitting $10^5$ OFDM symbols. For each symbol, the sample is stored which has the largest peak magnitude and the power of the OFDM symbol. Peak to average power ratio is obtained by dividing the peak magnitudes by the average power of all OFDM symbols. PAPR results are plotted by calculating the occurrence of symbols with a PAPR larger than a given PAPR.

Figure 8:
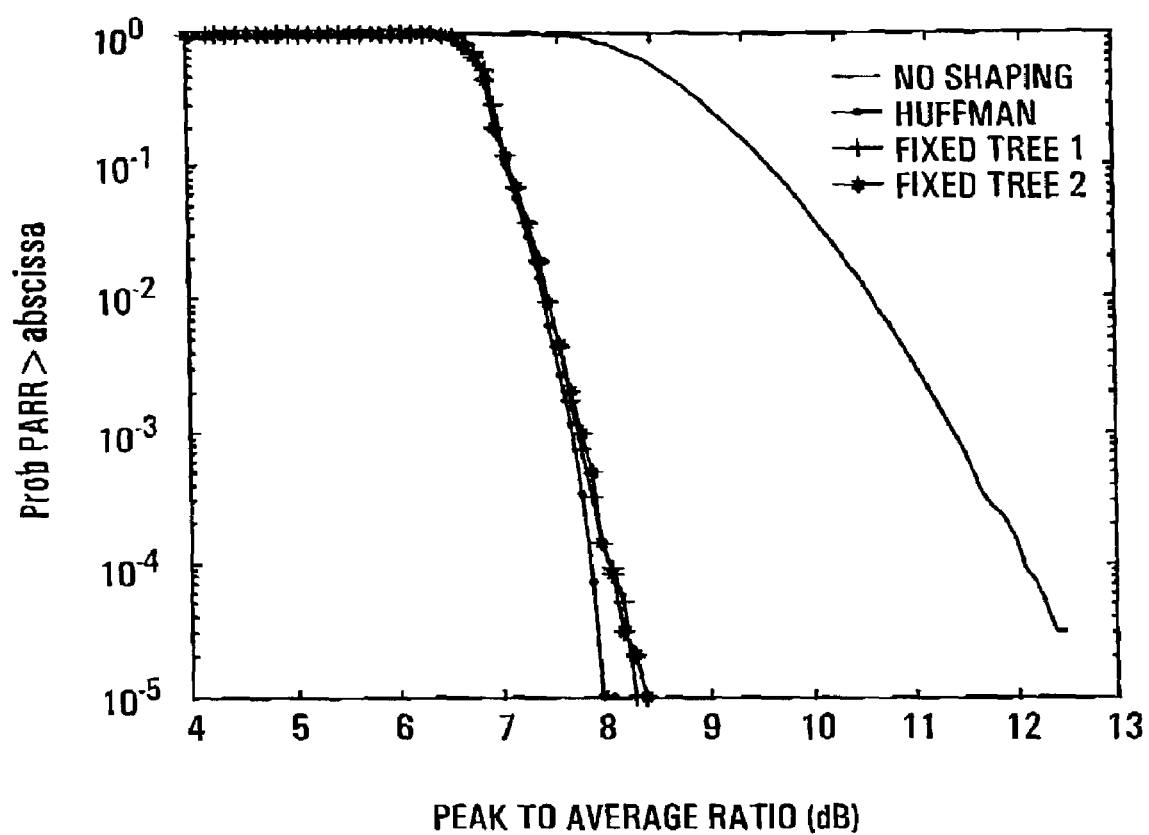
FIGS. 8, 9 and 10 are plots of performance results for the system of FIG. 5 with various constellation-shaping algorithms employed.
Figure 9:
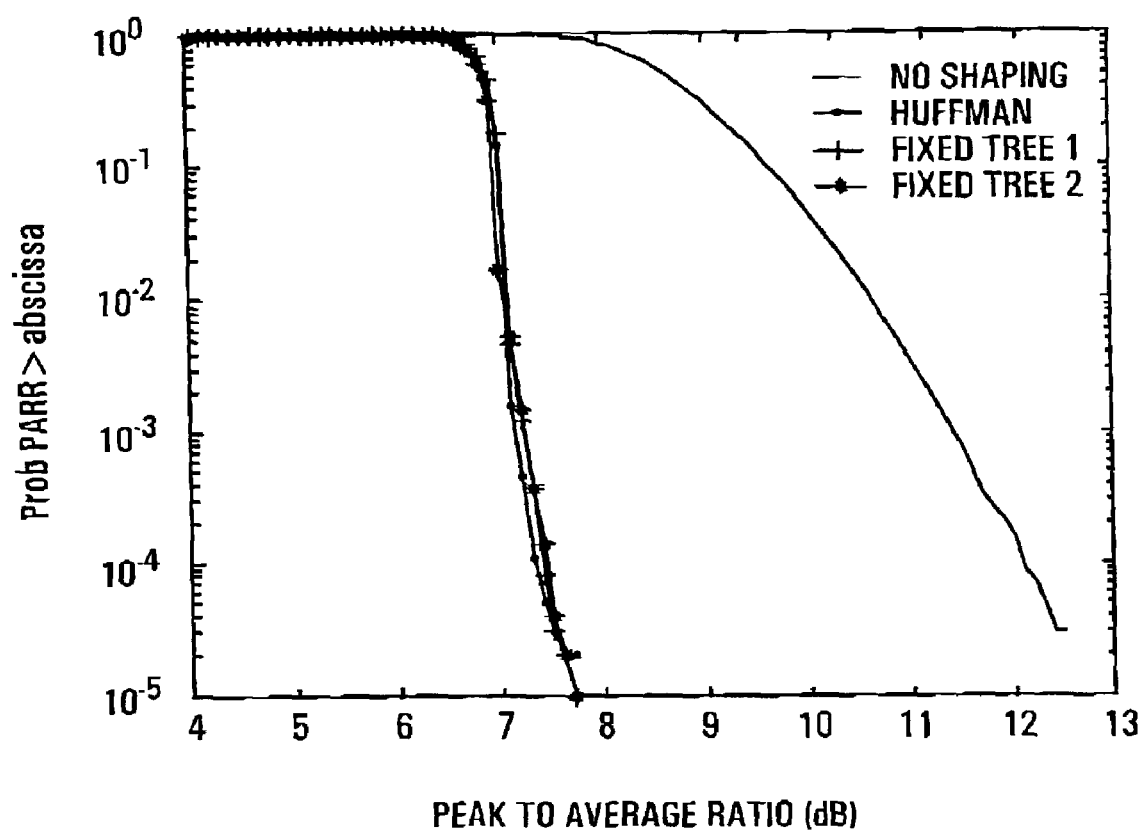

For the constellation-shaping algorithms, one dummy bit and 88 data bits are transmitted per 16 carriers, i.e. R=88+1=89. The results are plotted for both the Huffman tree and fixed tree structures. For the fixed tree, the two structures given in Table 2 are used. In FIG. 8, the PAPR is plotted with and without the constellation-shaping algorithm. The number of iterations is set to 12 and only a single solution is obtained. In FIG. 9, the number of iterations is set to 3 and four solutions are obtained in the iterative search algorithm and the best of the four is used.

For the results obtained, additional iterations and searching for another solution are not performed if PAPR is less than 7 dB for the OFDM symbol for some combinations of dummy bits. The number of IDFTs used in the iterative search algorithm is given by (number of solutions)×(number_of_iterations) and thus it is the same for the results plotted in FIGS. 8 and 9.

From the figures, it is observed that the tree structure used in the constellation-shaping algorithm effects the results slightly. Using an iterative search algorithm, the simulation which obtains one solution yields a PAPR of 7.9 dB at $10^{-4}$ and the simulation which obtains four solutions yields a PAPR of 7.4 dB at $10^{-4}$. Thus increasing the number of obtained solutions improves the performance of the PAPR algorithm somewhat.

Simulation results were also obtained for another variation of the shaping algorithm, which groups 8 carriers instead of 16. A fixed tree structure is employed with 4 levels where the tree structure is given in Table 3. Levels 1, 2, 3 and 4 are made up of 8, 4, 2 and 1 blocks respectively.

TABLE 3

Fixed Tree Structure 3

| | # of shells | # of points in each shell | # of bits read |
|---|---|---|---|
| Level 1 | 16 | 4 | 2 |
| Level 2 | 16 | 16 | 4 |
| Level 3 | 128 | 2 | 1 |
| Level 4 | 16384 | 1 | 11 |

In this case, the total number of bits sent by 8 carriers is 45, which is 5.625 bits per carrier, CER=$16/2^{k/8}$=1.30.

Figure 10:
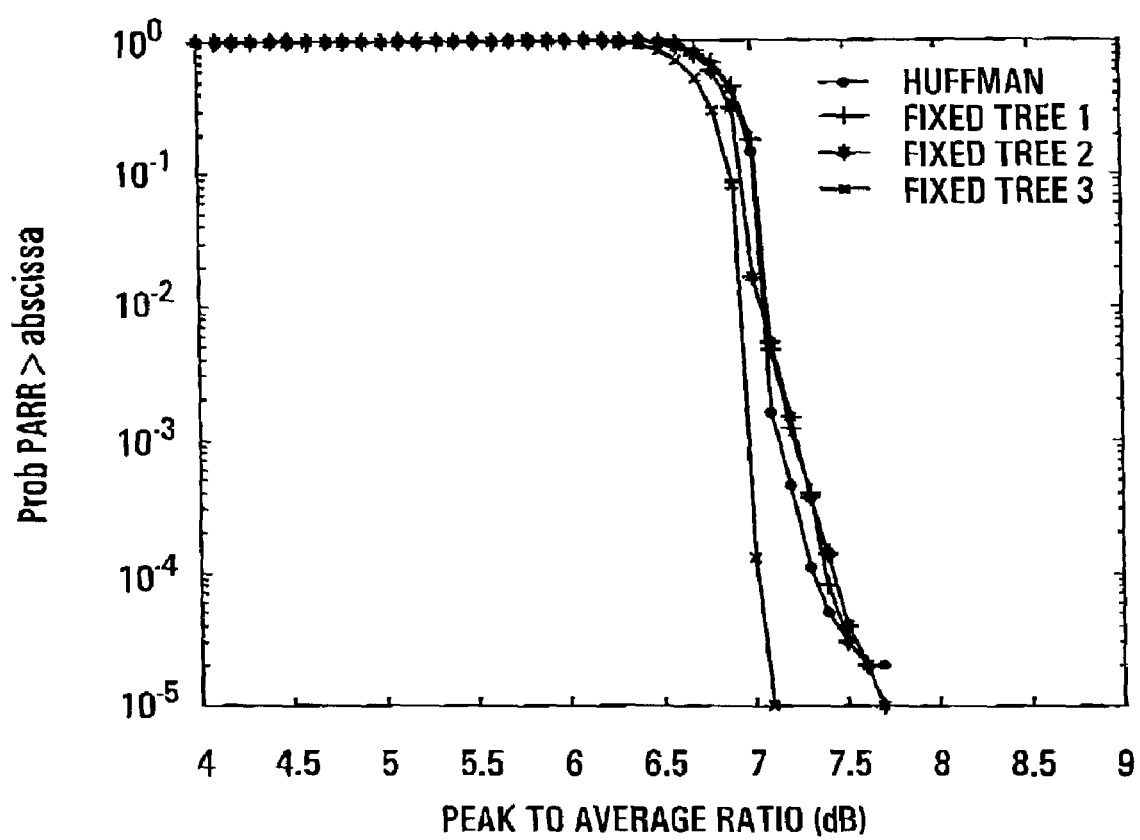

The results of different tree structures are given in FIG. 10. Fixed Tree Structure 3 improved PAPR by 0.4 dB at symbol clipping probability $10^{-4}$. The average power of an OFDM symbol with this constellation-shaping algorithm turned out to be 2.17 dB less than the one which uses no shaping, The throughput of the algorithm is slightly higher (5.625 vs. 5.5625 bits per carrier) than the ones which groups 16 carriers. As the number of dummy bits per symbol is twice more than the tree structures which groups 16 carriers, the number of IDFTs used is twice as large in the iterative search algorithm. The complexity of addressing bits to rings is lower, since the tree structure is simpler.

Numerous modifications and variations of the present invention are possible in light of the above teachings. It is therefore to be understood that within the scope of the appended claims, the invention may be practised otherwise than as specifically described herein.

REFERENCES

[1] G. D. Forney, J and L. F. Wei "Multidimensional constellations—Part I: Introduction, figures of merit, and generalized cross constellations," IEEE J. Select. Areas Commun., vol. SAC—7, pp. 877–892, August 1989.

[2] A. K. Khandani and P. Kabal, "Shaping multi-dimensional signal spaces-Part I: Optimum shaping, shell mapping," IEEE Trans. Inform. Theory, vol.IT-39, pp.1799–1808, Nov. 1993.

[3] A. K. Khandani and P. Kabal, "Shaping multi-dimensional signal spaces-Part II: shell-addressed constellations." IEEE Trans. Inform. Theory, vol.IT-39, pp. 1809–1819, Nov. 1993.

[4] F. R. Kschischang and S. Pasupathy, "Optimal shaping properties of the truncated polydisc," IEEE Trans. Inform. Theory, vol.40, pp. 892–903, May 1994.

The invention claimed is:

1. A multi-tone modulation method comprising:
   defining a respective signal constellation comprising a plurality of constellation points for each of a plurality of center frequencies;
   defining for each tone and for each permutation of values for M data elements, a respective set of at least one constellation point any one of which may be used to represent the permutation of values for M data elements thereby providing a choice of constellation points for the permutation of values for M data elements, with at least one said set of at least one constellation point having more than one constellation point;
   generating a multi-tone signal by mapping data elements to each of said plurality of signal constellations and where there is a choice of constellation points, selecting a constellation point which will result in a reduced peak average power ratio for the multi-tone signal.

2. A method according to claim 1 wherein selecting a constellation point which will result in a reduced peak power for the multi-tone signal where there is a choice of constellation points comprises searching through all possible permutations of choices of constellation points for a set of constellation points which will result in an absolute minimum possible peak average power ratio.

3. A method according to claim 1 wherein selecting a constellation point which will result in a reduced peak power for the multi-tone signal where there is a choice of constellation points comprises searching through possible permutations of choices of constellation points for a set of constellation points which will result in a peak average power ratio which is less than a predetermined threshold.

4. A method according to claim 1 wherein each set of at least one constellation point comprises two constellation points.

5. A method of modulating sets of M×K data elements to a multi-tone signal, with K data elements modulated to each of M center frequencies, where K>=1 and M>=2, the method comprising:
   for each of the M center frequencies and for each permutation of values for K data elements, defining a respective plurality of constellation points which may be used to represent the permutation of values for K data elements at that center frequency;
   for a particular set of M×K data elements defining a particular permutation of values for K data elements for each of the M center frequencies, determining for each of the M center frequencies the particular respective plurality of constellation points;
   selecting a single constellation point from each particular respective plurality of constellation points such that a peak average power ratio of the multi-tone signal is reduced.

6. A method according to claim 5 further comprising:
   in selecting the single constellation points, searching for all possible combinations of single constellation points from each particular respective plurality of constellation points such that the peak average power ratio of the multi-tone signal is a minimum possible value.

7. A method according to claim 5 further comprising:
   in selecting the single constellation points, searching for a combination of single constellation points from each particular respective plurality of constellation points such that the peak average power ratio of the multi-tone signal is less than a pre-determined threshold.

8. A method according to claim 7 wherein searching for a combination of single constellation points comprises:
   randomly selecting a constellation point from each particular respective plurality of constellation points;
   evaluating a peak average power ratio using the randomly selected constellation points;
   in the event the peak power ratio is less than the pre-determined threshold, stopping the search;
   repeatedly, until the peak average power ratio is less than the pre-determined threshold, changing at least one of the randomly selected constellation points to be a different constellation point in the particular respective plurality of constellation points to which the at least one of the randomly selected constellation points belongs and re-evaluating the peak average power ratio.

9. A method according to claim 1 further comprising for each respective signal constellation identifying the at least one constellation point for a given permutation of values for the M data elements by:
   performing constellation shaping each permutation of M data elements and at least one dummy data element, for each respective signal constellation the constellation shaping being performed for each permutation of dummy data element values to produce a respective shaped output, the respective shaped outputs for a given signal constellation collectively comprising the at least one constellation point for the permutation of values for the M data elements.

10. A method according to claim 9 wherein performing constellation shaping for a given signal constellation comprising a plurality of constellation points comprises:
- associating a cost with each of the plurality of constellation points;
- defining a hierarchy of blocks, the hierarchy having a plurality of layers comprising at least a first layer and a last layer, each layer having fewer blocks than each previous layer;
- wherein the first layer is formed by ordering all of the constellation points according to cost, and then assigning a first lowest cost group of constellation points to a first shaping partition, a second lowest cost group of constellation points to a second shaping partition dividing comprises a plurality of shaping partitions, and so on until a highest cost group of constellation points assigned to a last shaping partition, each shaping partition being assigned a cost based on the costs of the constellation points in the shaping partition, each shaping partition being a first layer block;
- wherein an element in each other layer is formed by combining two blocks of a previous layer and is assigned a cost based on the costs of the two blocks of the previous layer, a block of each layer being comprised of one of the elements according to cost, or a group of the elements according to cost;
- the last layer having a single block comprising a plurality of elements;
- shaping gain being achieved by only mapping to a subset of the elements of the last layer.

11. A method of performing constellation shaping for a signal constellation comprising a plurality of constellation points comprising:
- associating a cost with each of the plurality of constellation points;
- defining a hierarchy of blocks, the hierarchy having a plurality of layers comprising at least a first layer and a last layer, each layer having fewer blocks than each previous layer;
- wherein the first layer is formed by ordering all of the constellation points according to cost, and then assigning a first lowest cost group of constellation points to a first shaping partition, a second lowest cost group of constellation points to a second shaping partition dividing comprises a plurality of shaping partitions, and so on until a highest cost group of constellation points assigned to a last shaping partition, each shaping partition being assigned a cost based on the costs of the constellation points in the shaping partition, each shaping partition being a first layer block;
- wherein an element in each other layer is formed by combining two blocks of a previous layer and is assigned a cost based on the costs of the two blocks of the previous layer, a block of each layer being comprised of one of the elements according to cost, or a group of the elements according to cost;
- the last layer having a single block comprising a plurality of elements;
- shaping gain being achieved by only mapping to a subset of the elements of the last layer.

12. A method according to claim 11 wherein the cost assigned to each constellation point is its energy.

13. A method according to claim 12 wherein at least some of the layers blocks are simply reordered combined blocks of a previous layer.

14. A method according to claim 13 wherein for layers in which blocks are groups of re-ordered combined blocks of a previous layer, all groups are the same size.

15. A method according to claim 13 wherein at least one layer in which blocks are groups of re-ordered combined blocks of a previous layer, the groups have different sizes.

16. A method according to claim 11 further comprising:
performing addressing by:
- applying a first subset of a set of input bits to identify an element in the block of the highest layer;
- applying subsequent subsets of the set of input bits to identify blocks in subsequent layers, with a particular shaping partition being identified in the first layer;
- at the first layer, applying a final subset of input bits to identify a particular signal constellation point within the particular shaping partition identified in the first layer.

17. A method according to claim 16 wherein Huffman tree based addressing is employed.

18. A method according to claim 16 wherein fixed tree based addressing is employed.

19. A method according to claim 11 wherein a 256 point constellation is employed, there are 16 layer one partitions each comprising 16 constellation points, there are 8 layer two blocks each containing 16 elements, there are 4 layer 3 blocks each containing 8 elements, the 8 elements having sizes {16, 16, 32, 32, 32, 32, 32, 64}, there are 2 layer 4 blocks each containing 64 elements, and there is one layer 5 block containing 4096 elements.

20. A method according to claim 16 wherein the input bits comprise a plurality of data bits and at least one dummy bit, the method further comprising:
repeating the method of 16 for each permutation of values of the at least one dummy bit.

21. A method according to claim 20 further comprising:
repeating the method of claim 20 for each of a plurality of signal constellations to generate a respective plurality of shaped outputs for each signal constellation;
performing peak average power reduction by appropriate selection of a single shaped output from each respective plurality of shaped outputs.

22. A multi-tone modulator comprising:
- a signal generator adapted to generate signals for a respective signal constellation comprising a plurality of constellation points for each of a plurality of center frequencies;
- a constellation mapper adapted to define for each tone and for each permutation of values for M data elements, a respective set of at least one constellation point any one of which may be used to represent the permutation of values for M data elements thereby providing a choice of constellation points for the permutation of values for M data elements, with at least one said set of at least one constellation point having more than one constellation point;
- a peak average power reduction function (PAPR function) adapted to for each center frequency select a constellation point from the at least one constellation point mapped to by the constellation mapper which will result in a reduced peak average power ratio for the multi-tone signal, wherein the signal generate transmits using the constellation points selected by the peak average power reduction function.

23. A modulator according to claim 22 wherein the PAPR function is adapted to select a constellation point which will result in a reduced peak power for the multi-tone signal where there is a choice of constellation points by searching through all possible permutations of choices of constellation points for a set of constellation points which will result in an absolute minimum possible peak average power ratio.

24. A modulator according to claim 22 wherein the PAPR function is adapted to select a constellation point which will result in a reduced peak power for the multi-tone signal where there is a choice of constellation points by searching through possible permutations of choices of constellation points for a set of constellation points which will result in a peak average power ratio which is less than a predetermined threshold.

25. A modulator according to claim 22 further comprising for each respective signal constellation a respective constellation shaper adapted to identify the at least one constellation point for a given permutation of values for the M data elements by:
  performing constellation shaping each permutation of M data elements and at least one dummy data element, for each respective signal constellation the constellation shaping being performed for each permutation of dummy data element values to produce a respective shaped output, the respective shaped outputs for a given signal constellation collectively comprising the at least one constellation point for the permutation of values for the M data elements.

26. A modulator according to claim 25 wherein the constellation shaper is adapted to perform constellation shaping for a given signal constellation comprising a plurality of constellation points by:
  associating a cost with each of the plurality of constellation points;
  defining a hierarchy of blocks, the hierarchy having a plurality of layers comprising at least a first layer and a last layer, each layer having fewer blocks than each previous layer;
  wherein the first layer is formed by ordering all of the constellation points according to cost, and then assigning a first lowest cost group of constellation points to a first shaping partition, a second lowest cost group of constellation points to a second shaping partition dividing comprises a plurality of shaping partitions, and 50 on until a highest cost group of constellation points assigned to a last shaping partition, each shaping partition being assigned a cost based on the costs of the constellation points in the shaping partition, each shaping partition being a first layer block;
  wherein an element in each other layer is formed by combining two blocks of a previous layer and is assigned a cost based on the costs of the two blocks of the previous layer, a block of each layer being comprised of one of the elements according to cost, or a group of the elements according to cost;
  the last layer having a single block comprising a plurality of elements;
  shaping gain being achieved by only mapping to a subset of the elements of the last layer.

27. A modulator according to claim 26 wherein at least some of the layers blocks are simply reordered combined blocks of a previous layer.

28. A modulator according to claim 26 wherein for layers in which blocks are groups of re-ordered combined blocks of a previous layer, all groups are the same size.

29. A modulator according to claim 26 wherein at least one layer in which blocks are groups of re-ordered combined blocks of a previous layer, the groups have different sizes.

30. A modulator according to claim 26 further adapted to perform addressing by:
  applying a first subset of a set of input bits to identify an element in the block of the highest layer;
  applying subsequent subsets of the set of input bits to identify blocks in subsequent layers, with a particular shaping partition being identified in the first layer;
  at the first layer, applying a final subset of input bits to identify a particular signal constellation point within the particular shaping partition identified in the first layer.

31. A modulator according to claim 30 wherein Huffman tree based addressing is employed.

32. A modulator according to claim 30 wherein fixed tree based addressing is employed.

33. A modulator according to claim 30 wherein a 256 point constellation is employed, there are 16 layer one partitions each comprising 16 constellation points, there are 8 layer two blocks each containing 16 elements, there are 4 layer 3 blocks each containing 8 elements, the 8 elements having sizes $\{16, 16, 32, 32, 32, 32, 32, 64\}$, there are 2 layer 4 blocks each containing 64 elements, and there is one layer 5 block containing 4096 elements.

34. A modulator comprising:
  shaping means for performing constellation shaping for each of a plurality of signal constellations a plurality of times to produce a respective plurality of shaped outputs;
  peak average power reduction means for selecting a respective single shaped output from each plurality of shaped outputs such that a signal formed by combining the single shaped outputs has reduced peak power.

35. A computer readable medium having instructions stored thereon for instructing a processing platform to perform peak power reduction, the instructions comprising:
  code means defining a respective signal constellation comprising a plurality of constellation points for each of a plurality of center frequencies;
  code means for defining for each tone and for each permutation of values for M data elements, a respective set of at least one constellation point any one of which way be used to represent the permutation of values for M data elements thereby providing a choice of constellation points for the permutation of values for M data elements, with at least one said set of at least one constellation point having more than one constellation point;
  code means for generating a multi-tone signal by mapping data elements to each of said plurality of signal constellations and where there is a choice of constellation points, selecting a constellation point which will result in a reduced peak average power ratio for the multi-tone signal.

36. A computer readable medium having instructions stored thereon for instructing a processing platform to perform constellation shaping for a signal constellation comprising a plurality of constellation points comprising:
  code means for associating a cost with each of the plurality of constellation points;
  code means for defining a hierarchy of blocks, the hierarchy having a plurality of layers comprising at least a first layer and a last layer, each layer having fewer blocks than each previous layer;
  wherein the first layer is formed by ordering all of the constellation points according to cost, and then assigning a first lowest cost group of constellation points to a first shaping partition, a second lowest cost group of constellation points to a second shaping partition dividing comprises a plurality of shaping partitions, and so on until a highest cost group of constellation points assigned to a last shaping partition, each shaping partition being assigned a cost based on the costs of the constellation points in the shaping partition, each shaping partition being a first layer block;

wherein an element in each other layer is formed by combining two blocks of a previous layer and is assigned a cost based on the costs of the two blocks of the previous layer, a block of each layer being comprised of one of the elements according to cost, or a group of the elements according to cost;

the last layer having a single block comprising a plurality of elements;

shaping gain being achieved by only mapping to a subset of the elements of the last layer.

37. A processing platform adapted to implement a method according to claim 11.

* * * * *

UNITED STATES PATENT AND TRADEMARK OFFICE
CERTIFICATE OF CORRECTION

PATENT NO.         : 7,151,804 B2                            Page 1 of 1
APPLICATION NO.    : 10/226172
DATED              : December 19, 2006
INVENTOR(S)        : Wen Tong et al.

It is certified that error appears in the above-identified patent and that said Letters Patent is hereby corrected as shown below:

Title Page, Item (75) Inventors:

The first inventor's address should be amended from "Ottowa" to -- Ottawa-- ;
The second inventor's last name should be amended from "Khandan1" to -- Khandani -- ;

Title Page, Item (56) Reference Cited:

OTHER PUBLICATIONS

Last non-patent reference to include the authors names -- P. Van Eetvlet, G. Wade and M. Tomlinson);

Column 21, Claim 26, line 42, "50" should be corrected to -- so -- ;

Column 22, Claim 35, line 42, "way" should be corrected -- may --

Signed and Sealed this

Eleventh Day of September, 2007

JON W. DUDAS
*Director of the United States Patent and Trademark Office*